(12) United States Patent
Yin

(10) Patent No.: US 10,916,193 B2
(45) Date of Patent: Feb. 9, 2021

(54) PIXEL DRIVING CIRCUIT, DISPLAY DEVICE, AND DRIVING METHOD

(71) Applicant: BOE TECHNOLOGY GROUP CO., LTD., Beijing (CN)

(72) Inventor: Xinshe Yin, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/036,119

(22) Filed: Jul. 16, 2018

(65) Prior Publication Data

US 2019/0114967 A1    Apr. 18, 2019

(30) Foreign Application Priority Data

Oct. 13, 2017  (CN) .......................... 2017 1 0951433

(51) Int. Cl.
*G09G 3/3258* (2016.01)
*G09G 3/3233* (2016.01)
(Continued)

(52) U.S. Cl.
CPC ............. *G09G 3/3258* (2013.01); *G09G 3/20* (2013.01); *G09G 3/3233* (2013.01); *G09G 3/3291* (2013.01); *H01L 27/3262* (2013.01); *H01L 27/3265* (2013.01); *H01L 27/3276* (2013.01); *G09G 2310/0264* (2013.01)

(58) Field of Classification Search
CPC .. G09G 3/3258; G09G 3/3291; G09G 3/3233; G09G 2310/0264; G09G 3/20; G09G 3/3208; H01L 27/3276; H01L 27/3265; H01L 27/3262
See application file for complete search history.

(56) References Cited

U.S. PATENT DOCUMENTS 7,382,340 B2    6/2008  Kim et al.
8,063,855 B2 *  11/2011  Takahara ............... G09G 3/006
                                                                345/76
(Continued)

FOREIGN PATENT DOCUMENTS

CN    101887687 A    11/2010
CN    103325338 A     9/2013
(Continued)

OTHER PUBLICATIONS

First Office Action for CN Application No. 201710951433.9 dated Mar. 18, 2019.

*Primary Examiner* — Chad M Dicke
(74) *Attorney, Agent, or Firm* — Dinsmore & Shohl LLP

(57) ABSTRACT

The present disclosure provides a pixel driving circuit, a display device, and a driving method. The pixel driving circuit comprises a driving transistor, a light emitting element, a first capacitor, a second capacitor, a write circuit, and a first switch transistor. The write circuit is configured to write a reference level to a second terminal of the first capacitor during a vertical blanking stage, and write a data level to a second terminal of the second capacitor during a effective display stage. The first switch transistor is configured to write a voltage of a first voltage terminal and a threshold voltage of the driving transistor to a first terminal of the first capacitor during the vertical blanking stage and is turned off during the effective display stage.

19 Claims, 11 Drawing Sheets

(51) Int. Cl.
*G09G 3/3291* (2016.01)
*G09G 3/20* (2006.01)
*H01L 27/32* (2006.01)

(56) References Cited

U.S. PATENT DOCUMENTS

| | | | | |
|---|---|---|---|---|
| 9,489,875 B2* | 11/2016 | Hwang | | G09G 3/003 |
| 10,170,054 B2* | 1/2019 | Park | | G09G 3/3233 |
| 10,297,781 B2* | 5/2019 | Yoon | | H01L 51/0508 |
| 10,388,219 B2* | 8/2019 | Lee | | G09G 3/3225 |
| 2006/0044244 A1* | 3/2006 | Numao | | G09G 3/3233 |
| | | | | 345/92 |
| 2012/0105605 A1* | 5/2012 | Nam | | G09G 3/003 |
| | | | | 348/51 |
| 2013/0249883 A1* | 9/2013 | Hwang | | G09G 3/003 |
| | | | | 345/212 |
| 2014/0192037 A1* | 7/2014 | Chung | | G09G 3/2022 |
| | | | | 345/212 |
| 2015/0145972 A1* | 5/2015 | Irie | | G09G 3/34 |
| | | | | 348/55 |
| 2016/0042691 A1* | 2/2016 | Na | | G09G 3/3266 |
| | | | | 345/205 |
| 2016/0372049 A1 | 12/2016 | Wang et al. | | |
| 2017/0206837 A1* | 7/2017 | Jeon | | G09G 3/3258 |
| 2018/0005576 A1* | 1/2018 | Yoon | | G09G 3/3233 |
| 2018/0005601 A1* | 1/2018 | Kim | | G09G 5/10 |
| 2019/0114967 A1* | 4/2019 | Yin | | G09G 3/3258 |

FOREIGN PATENT DOCUMENTS

| | | |
|---|---|---|
| CN | 103854609 A | 6/2014 |
| CN | 104658480 A | 5/2015 |
| CN | 104103238 B | 4/2016 |
| CN | 105590579 A | 5/2016 |
| CN | 205920745 U | 2/2017 |
| CN | 106782324 A | 5/2017 |
| CN | 106803417 A | 6/2017 |

* cited by examiner

PIXEL DRIVING CIRCUIT, DISPLAY DEVICE, AND DRIVING METHOD

CROSS-REFERENCE TO RELATED APPLICATIONS

The present application claims priority to Chinese Patent Application No. 201710951433.9, filed on Oct. 13, 2017, the disclosure of which is incorporated by reference herein in its entirety.

TECHNICAL FIELD

The present disclosure relates to a pixel driving circuit, a display device, and a driving method.

BACKGROUND

At present, OLED (Organic Light Emitting Diode) has been increasingly applied to display devices. In the related art, the pixel driving circuit of OLED may be in the form of a 2T1C circuit. That is, the pixel driving circuit comprises two transistors (one switch transistor and one driving transistor) and one capacitor.

SUMMARY

According to a first aspect of embodiments of the present disclosure, there is provided a pixel driving circuit, the pixel driving circuit comprising: a driving transistor, comprising a control electrode, a first electrode electrically connected to a first voltage terminal, and a second electrode; a light emitting element configured to be driven by the driving transistor to emit light and disposed between the second electrode and a second voltage terminal, wherein a voltage of the second voltage terminal is different from that of the first voltage terminal; a first capacitor, a first terminal of which is electrically connected to the control electrode; a second capacitor, a first terminal of which is electrically connected to the first voltage terminal or electrically connected to the second voltage terminal; a write circuit configured to write a reference level from a data line to a second terminal of the first capacitor during a vertical blanking stage, and to write a data level from the data line to a second terminal of the second capacitor during a effective display stage, in response to a control signal from at least one control line and a gate voltage signal from a gate line; and a first switch transistor, electrically connected between the control electrode and the second electrode, and configured to write the voltage of the first voltage terminal and a threshold voltage of the driving transistor to a first terminal of the first capacitor, in response to the control signal during the vertical blanking stage, and to be turned off during the effective display stage.

In some embodiments, the write circuit comprises: a second switch transistor electrically connected between the second terminal of the first capacitor and the date line and configured to be turned on in response to the control signal during the vertical blanking stage and to be turned off during the effective display stage; a third switch transistor electrically connected between the second terminal of the first capacitor and the second terminal of the second capacitor and configured to be turned off in response to the control signal during the vertical blanking stage and to be turned on during the effective display stage; and a fourth switch transistor electrically connected between the data line and the second terminal of the second capacitor and configured to be turned off in response to the gate voltage signal during the vertical blanking stage and to be turned on in response to the gate voltage signal corresponding to the data level during the effective display stage.

In some embodiments, the at least one control line comprises: a first control line configured to provide a first control signal to gates of the first switch transistor and the second switch transistor; and a second control line configured to provide a second control signal to a gate of the third switch transistor, wherein a level of the second control signal is opposite to that of the first control signal; wherein the first switch transistor, the second switch transistor and the third switch transistor are of the same type of switch transistor.

In some embodiments, each of the first switch transistor, the second switch transistor and the third switch transistor is a PMOS transistor or is an NMOS transistor.

In some embodiments, the first switch transistor and the second switch transistor have a first conductive type, and the third switch transistor has a second conductive type opposite to the first conductive type; the at least one control line is configured to provide the same control signal to gates of the first switch transistor, the second switch transistor and the third switch transistor.

In some embodiments, the first switch transistor and the second switch transistor are both PMOS transistors, and the third switch transistor is a NMOS transistor; or, the first switch transistor and the second switch transistor are both NMOS transistors, and the third switch transistor is a PMOS transistor.

In some embodiments, the pixel driving circuit further comprises: a fifth switch transistor electrically connected between the second electrode of the driving transistor and the light emitting element, and the fifth switch transistor configured to interrupt an electrical coupling between the second electrode of the driving transistor and the light emitting element in response to the control signal during the vertical blanking stage, and to turn on the electrical coupling between the second electrode of the driving transistor and the light emitting element during the effective display stage.

In some embodiments, the at least one control line comprises: a first control line configured to provide a first control signal to gates of the first switch transistor and the second switch transistor; and a second control line configured to provide a second control signal to gates of the third switch transistor and the fifth switch transistor, wherein a level of the second control signal is opposite to that of the first control signal; wherein the first switch transistor, the second switch transistor, the third switch transistor and the fifth switch transistor are of the same type of switch transistor.

In some embodiments, each of the first switch transistor, the second switch transistor, the third switch transistor and the fifth switch transistor is a PMOS transistor or is an NMOS transistor.

In some embodiments, the first switch transistor and the second switch transistor have a first conductive type, and the third switch transistor and the fifth switch transistor have a second conductive type opposite to the first conductive type; the at least one control line is configured to provide the same control signal to gates of the first switch transistor, the second switch transistor, the third switch transistor and the fifth switch transistor.

In some embodiments, the first switch transistor and the second switch transistor are both PMOS transistors, and the third switch transistor and the fifth switch transistor are both NMOS transistors; or the first switch transistor and the second switch transistor are both NMOS transistors, and the third switch transistor and the fifth switch transistor are both PMOS transistors.

In some embodiments, the driving transistor is a PMOS transistor, the first voltage terminal is a power supply voltage terminal, and the second voltage terminal is a ground terminal; or the driving transistor is an NMOS transistor, the first voltage terminal is a ground terminal, and the second voltage terminal is a power supply voltage terminal.

In some embodiments, in the case that the driving transistor is a PMOS transistor, the first terminal of the second capacitor is electrically connected to the power supply voltage terminal; or in the case that the driving transistor is an NMOS transistor, the first terminal of the second capacitor is electrically connected to the ground terminal.

According to a second aspect of embodiments of the present disclosure, there is provided a display device, the display device comprising: a pixel array, comprising a plurality of pixel units, each of the pixel units comprising an aforementioned pixel driving circuit; at least one control line electrically connected to the pixel driving circuit of each of the pixel units; a plurality of data lines, wherein each of the data lines is electrically connected with the pixel driving circuit of each of the pixel units in the same column of the pixel array; and a plurality of gate lines, wherein each of the gate lines is electrically connected with the pixel driving circuit of each of the pixel units in the same row of the pixel array.

In some embodiments, the display device further comprises: a first power line electrically connected to the first voltage terminal corresponding to the pixel driving circuit of each of the pixel units, and configured to provide a voltage of the first voltage terminal; and a second power line electrically connected to the second voltage terminal corresponding to the pixel driving circuit of each of the pixel units, and configured to provide a voltage of the second voltage terminal.

In some embodiments, in the case that the driving transistor of the pixel driving circuit is a PMOS transistor, the first power line is a power supply voltage line, and the second power line is a ground line; in the case that the driving transistor of the pixel driving circuit is an NMOS transistor, the first power line is a ground line, and the second power line is a power supply voltage line.

According to a third aspect of embodiments of the present disclosure, there is provided a driving method for a pixel driving circuit, the driving method comprising: receiving a reference level during a vertical blanking stage; writing the reference level to a second terminal of a first capacitor by a write circuit, and writing a voltage of a first voltage terminal and a threshold voltage of a driving transistor to a first terminal of the first capacitor by a first switch transistor; receiving a data level during an effective display stage; writing the data level to a second terminal of a second capacitor by the write circuit, and obtaining a voltage applied to a control electrode of the driving transistor by the first capacitor, so that the driving transistor outputs a current corresponding to a voltage between the control electrode and a first electrode of the driving transistor, to drive a light emitting element to emit light.

In some embodiments, a duration time of the reference level is shorter than that of the vertical blanking stage.

According to a fourth aspect of embodiments of the present disclosure, there is provided a driving method for a display device, the driving method comprising: receiving a reference level during a vertical blanking stage; writing the reference level to a second terminal of a first capacitor of a pixel driving circuit of each pixel unit by a write circuit of the pixel driving circuit of each pixel unit, and writing a voltage of a first voltage terminal and a threshold voltage of a driving transistor to a first terminal of the first capacitor of the pixel driving circuit of each pixel unit by a first switch transistor of the pixel driving circuit of each pixel unit; for each row of pixel units, sequentially receiving a data level for the pixel driving circuit of each pixel unit in the row during an effective display stage; and writing the data level to a second terminal of a second capacitor of each pixel driving circuit by a write circuit of each pixel driving circuit, and obtaining a voltage applied to a control electrode of a driving transistor of each pixel driving circuit by a first capacitor of each pixel driving circuit, so that the driving transistor outputs a current corresponding to a voltage between the control electrode and a first electrode of the driving transistor, to drive a light emitting element of each pixel driving circuit to emit light.

In some embodiments, a duration time of the reference level is shorter than that of the vertical blanking stage.

Other features of the present disclosure and the advantages thereof will become explicit by the following detailed descriptions of the exemplary embodiments of the present disclosure with reference to the accompanying drawings.

BRIEF DESCRIPTION OF THE DRAWINGS

The accompanying drawings, which constitute a part of the specification, describe the embodiments of the present disclosure and, together with the description, serve to explain the principles of the present disclosure.

The present disclosure will be more clearly understood from the following detailed description with reference to the accompanying drawings, in which.

DETAILED DESCRIPTION

Figure 1:
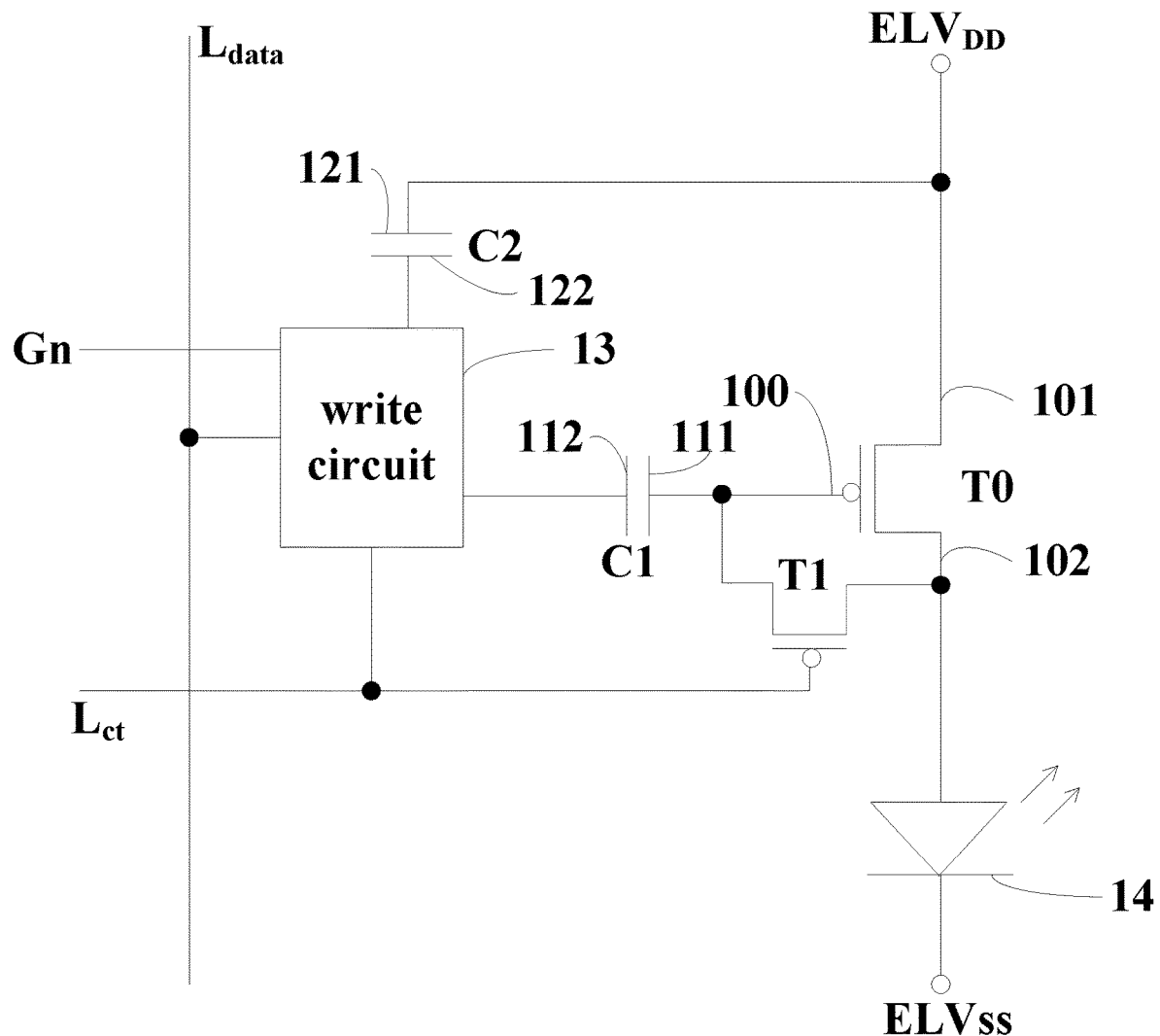
FIG. 1 is a circuit connection diagram illustrating a pixel driving circuit according to some embodiments of the present disclosure.

Various exemplary embodiments of the present disclosure will now be described in detail with reference to the accompanying drawings. However, the present disclosure may be embodied in many different forms, but should not be limited to the embodiments described here. By contrary, these embodiments are provided to facilitate that the present disclosure is thorough and complete, and will adequately present the scope of the present disclosure to those skilled in the art. It should be noted that: unless additionally specified, the relative arrangements, numerical expressions and numerical values of the components and steps expounded in these examples do not limit the scope of the present invention.

At the same time, it should be understood that, in order to facilitate the description, the dimensions of various parts shown in the drawings are not delineated according to actual proportional relations.

Unless otherwise defined, all the terms (including technical and scientific terms) used in the present disclosure have the same meanings as commonly understood by those skilled in the art of the present disclosure. It is also to be understood that those terms defined in for example general dictionaries should be construed as having meanings consistent with those in the context of the related art, rather than being construed in an idealized or extremely formalized sense unless thus explicitly defined here.

The words "first", "second", and similar words used in the present disclosure do not denote any order, quantity or importance, but merely serve to distinguish different constituent parts. Such similar words as "comprising" or "containing" mean that an element or article preceding the word covers elements or objects as well as their equivalents listed after the word, but do not exclude other elements or objects. Such similar words as "connecting" or "connected" are not limited to a physical or mechanical connection, but may include electrical connection, regardless of direct or indirect connection.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

The following descriptions of at least one exemplary embodiment which are in fact merely descriptive, by no means serve as any delimitation on the present disclosure as well as its application or use.

The techniques, methods, and devices known to a common technical person in the relevant art may not be discussed in detail, but where appropriate, the techniques, methods, and devices should be considered as part of the description.

Among all the examples shown and discussed here, any specific value should be construed as being merely illustrative, rather than as a delimitation. Thus, other examples of exemplary embodiments may have different values.

In addition, in various embodiments of the present disclosure, the same or similar reference numerals denote the same or similar members.

The inventors have found that the pixel driving circuit of the related art easily results in a phenomenon of uneven brightness within a small range when an image is displayed due to different threshold voltages $V_{th}$ of the driving transistor. In addition, since the power line of the display screen has a resistance, when the current flows through the power line, a voltage drop (IR (current×resistance) drop) is produced on the power line. This causes the power supply voltage $ELV_{DD}$ of each pixel point to gradually decrease along the power line, so that the brightness of the display screen gradually becomes bright or dark, which causes poor bright evenness.

In view of this, an embodiment of the present disclosure provides a pixel driving circuit. The pixel driving circuit according to some embodiments of the present disclosure will be described in detail below in combination with the accompanying drawings.

FIG. 1 is a circuit connection diagram illustrating a pixel driving circuit according to some embodiments of the present disclosure. As shown in FIG. 1, the pixel driving circuit is electrically connected to a first voltage terminal (e.g., a power supply voltage terminal $ELV_{DD}$), a second voltage terminal (e.g., a ground terminal $ELV_{SS}$), a data line $L_{data}$, at least one control line $L_{ct}$, and a gate line Gn respectively. Here, the data line $L_{data}$ is configured to provide a reference level $V_{ref}$ during a vertical blanking stage and provide a data level $V_{data}$ during an effective display stage. The at least one control line $L_{ct}$ is configured to provide a control signal. The gate line Gn is configured to provide a gate voltage signal. Gn denotes the $n^{th}$ gate line, and n is a positive integer.

As shown in FIG. 1, the pixel driving circuit may comprise: a driving transistor T0, a light emitting element 14 driven by the driving transistor T0 to emit light, a first capacitor C1, a second capacitor C2, a write circuit 13, and a first switch transistor T1.

As shown in FIG. 1, the driving transistor T0 comprises a control electrode 100, a first electrode 101 electrically connected to the first voltage terminal (e.g., the power supply voltage terminal $ELV_{DD}$), and a second electrode 102. The driving transistor T0 is configured to output a current (it may be referred to as a driving current) corresponding to a voltage between the control electrode 100 and the first electrode 101. For example, the driving transistor T0 may be a PMOS transistor. The control electrode, the first electrode, and the second electrode of the driving transistor T0 are respectively a gate, a source, and a drain of the PMOS transistor.

As shown in FIG. 1, the light emitting element 14 is disposed between the second electrode 102 and the second voltage terminal (e.g., the ground terminal $ELV_{SS}$). The light emitting element 14 is configured to emit light upon receiving the current output from the driving transistor. For example, the light emitting element may be an OLED. The voltage of the second voltage terminal is different from the voltage of the first voltage terminal. For example, in the case that the driving transistor is a PMOS transistor, the voltage of the second voltage terminal is lower than the voltage of the first voltage terminal. Also for example, in the case that the driving transistor is an NMOS transistor, the voltage of the second voltage terminal is higher than the voltage of the first voltage terminal.

As shown in FIG. 1, the first terminal 111 of the first capacitor C1 is electrically connected to the control electrode 100. The second terminal 112 of the first capacitor C1 is electrically connected to the write circuit 13.

As shown in FIG. 1, the first terminal 121 of the second capacitor C2 is electrically connected to the first voltage terminal (such as the power supply voltage terminal $ELV_{DD}$, as shown in FIG. 1) or electrically connected to the second voltage terminal (such as the ground terminal $ELV_{SS}$, not shown in FIG. 1). The second terminal 122 of the second capacitor C2 is electrically connected to the write circuit 13. For example, in the case that the driving transistor is a PMOS transistor, the first terminal of the second capacitor is electrically connected to the power supply voltage terminal. This makes the circuit more stable and the manufacture of the circuit easier.

As shown in FIG. 1, the write circuit 13 is also electrically connected with the data line $L_{data}$, the at least one control line $L_{ct}$, and the gate line Gn respectively, in addition to being electrically connected with the first capacitor C1 and the second capacitor C2 respectively. The write circuit 13 is configured to write the reference level from the data line $L_{data}$ to the second terminal 112 of the first capacitor C1 during the vertical blanking stage, and to write the data level from the data line $L_{data}$ to the second terminal 122 of the second capacitor C2 during the effective display stage, in response to the control signal from the at least one control line $L_{ct}$ and the gate voltage signal from the gate line Gn.

As shown in FIG. 1, the first switch transistor T1 is electrically connected between the control electrode 100 and the second electrode 102. The gate of the first switch transistor T1 is electrically connected to the control line $L_{ct}$. The first switch transistor T1 is configured to write the voltage of the first voltage terminal (e.g., the power supply voltage terminal $ELV_{DD}$) and a threshold voltage of the driving transistor T0 to the first terminal 111 of the first capacitor C1 in response to the control signal from the control line $L_{ct}$ during the vertical blanking stage, and to be turned off during the effective display stage.

In the pixel driving circuit of the aforementioned embodiments, during the vertical blanking stage, the reference level from the data line is written to the second terminal of the first capacitor by a write circuit, and the voltage of the first voltage terminal and the threshold voltage of the driving transistor are written to the first terminal of the first capacitor by the first switch transistor. During the effective display stage, the data level from the data line is written to the second terminal of the second capacitor by the write circuit. In this way, the driving current output from the driving transistor is no longer related to the threshold voltage of the driving transistor and the power supply voltage $ELV_{DD}$, and thus the driving current of the driving transistor is no longer affected by the threshold voltage and the power supply voltage. The driving current is related to the data level and the reference level. Since both the data level and the reference level are stable level signals, the pixel driving circuit can reduce the phenomenon of uneven brightness when the image is displayed (for example, the phenomenon of uneven brightness within a small range or the phenomenon that the brightness of the display screen gradually becomes bright or dark).

Moreover, in the aforementioned embodiments, the reference level and the data level are written to the corresponding capacitors during the vertical blanking stage and during the effective display stage, respectively. In the process of writing the reference level, the threshold voltage of the driving transistor is also written to the first terminal of the first capacitor, so that the writing stage is referred to as a threshold voltage establishing stage. The threshold voltage establishing stage is applied to the field retrace time, and the standard timing of the stage is several to several tens of rows of scan time.

During the threshold voltage establishing stage, the driving transistor and the first switch transistor is equivalent to one diode. The process of writing the threshold voltage to the first terminal of the first capacitor is actually the charging process of the first capacitor. In the charging process, the voltage difference between the first voltage terminal and the first terminal of the first capacitor gradually decreases, so that the charging current to the first terminal of the first capacitor will gradually decrease. Since the turn-on resistance of the aforementioned equivalent diode is larger than the turn-on resistance of the switch transistor, the writing time of the threshold voltage is relatively longer. In the embodiment of the present disclosure, the threshold voltage establishing stage is included in the vertical blanking stage, and the vertical blanking stage usually has several to several tens of rows of scan time (for example, one row of scan time is several microseconds to several tens of microseconds). Therefore, although the writing time of the threshold voltage is relatively longer, the pixel driving circuit of the embodiment of the present disclosure has sufficient time to ensure that the threshold voltage is adequately written to the first terminal of the first capacitor.

Figure 2:
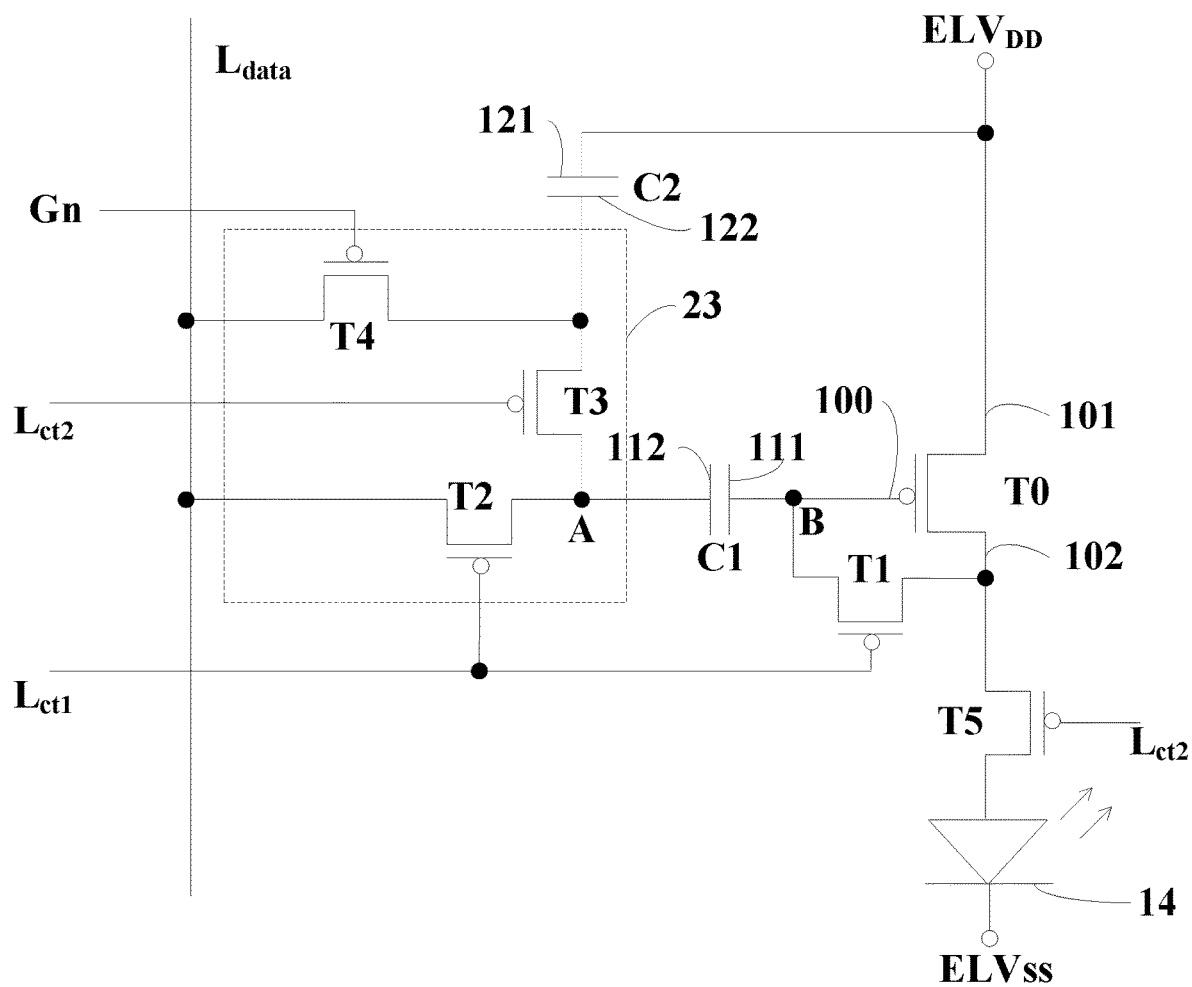
FIG. 2 is a circuit connection diagram illustrating a pixel driving circuit according to further embodiments of the present disclosure.

FIG. 2 is a circuit connection diagram illustrating a pixel driving circuit according to further embodiments of the present disclosure. The write circuit 23 shown in FIG. 2 is one embodiment of the write circuit 13 in FIG. 1.

In some embodiments, as shown in FIG. 2, the write circuit 23 comprises a second switch transistor T2. The second switch transistor T2 is electrically connected between the second terminal 112 of the first capacitor C1 and the data line $L_{data}$. The second switch transistor T2 is configured to be turned on in response to the control signal during the vertical blanking stage and to be turned off during the effective display stage.

As shown in FIG. 2, the write circuit 23 further comprises a third switch transistor T3. The third switch transistor T3 is electrically connected between the second terminal 112 of the first capacitor C1 and the second terminal 122 of the second capacitor C2. The third switch transistor T3 is configured to be turned off in response to the control signal during the vertical blanking stage and to be turned on during the effective display stage.

As shown in FIG. 2, the write circuit 23 further comprises a fourth switch transistor T4. The fourth switch transistor T4 is electrically connected between the data line $L_{data}$ and the second terminal 122 of the second capacitor C2. The fourth switch transistor T4 is configured to be turned off in response to the gate voltage signal during the vertical blanking stage and to be turned on in response to the gate voltage signal corresponding to the data level during the effective display stage.

In some embodiments, as shown in FIG. 2, the at least one control line $L_{ct}$ comprises a first control line $L_{ct1}$ and a second control line $L_{ct2}$. The first control line $L_{ct1}$ is configured to provide a first control signal to the gates of the first switch transistor T1 and the second switch transistor T2. The second control line $L_{ct2}$ is configured to provide a second control signal to the gate of the third switch transistor T3. The level of the second control signal is opposite to that of the first control signal. The first switch transistor T1, the second switch transistor T2 and the third switch transistor T3 are of the same type of switch transistor. For example, as shown in FIG. 2, the first switch transistor T1, the second switch transistor T2 and the third switch transistor T3 are all PMOS transistors. In some embodiments, the driving transistor T0 and the fourth switch transistor T4 are both PMOS transistors. In the embodiment, the same type of transistor facilitates the manufacture of the circuit.

In some embodiments, as shown in FIG. 2, the pixel driving circuit further comprises a fifth switch transistor T5. The fifth switch transistor T5 is electrically connected between the second electrode 102 of the driving transistor T0 and the light emitting element 14. For example, as shown in FIG. 2, the fifth switch transistor T5 is a PMOS transistor. The gate of the fifth switch transistor T5 is electrically connected to the second control line $L_{ct2}$. The second control line $L_{ct2}$ is configured to provide the second control signal to the gate of the fifth switch transistor T5. The fifth switch transistor T5 is configured to be turned off in response to the control signal (e.g., the second control signal from the second control line $L_{ct2}$) during the vertical blanking stage, so as to interrupt the electric coupling between the second electrode 102 of the transistor T0 and the light emitting element 14. The fifth switch transistor T5 is further configured to be turned on during the effective display stage (e.g., in response to the control signal (e.g., the second control signal from the second control line $L_{ct2}$)), so as to turn on the electric coupling between the second electrode 102 of the driving transistor T0 and the light emitting element 14. In the embodiment, during the vertical blanking stage, the fifth switch transistor interrupts the electrical coupling between the second electrode of the driving transistor and the light emitting element, thereby facilitating more stably writing the voltage of the first voltage terminal and the threshold voltage of the driving transistor to the first terminal of the first capacitor.

In some embodiments, the first switch transistor T1, the second switch transistor T2, the third switch transistor T3 and the fifth switch transistor T5 are of the same type of switch transistor. This facilitates the manufacture of the circuit.

It should be noted that, the connection relations of the source/drain of the switch transistor (e.g., the first switch transistor, the second switch transistor, the third switch transistor, the fourth switch transistor, or the fifth switch transistor) in the embodiment of the present disclosure with other devices or lines is not limited. For example, the source of the first switch transistor is electrically connected with the second electrode of the driving transistor, and the drain of the first switch transistor is electrically connected with the control electrode of the driving transistor. Also for example, the drain of the first switch transistor is electrically connected with the second electrode of the driving transistor, and the source of the first switch transistor is electrically connected with the control electrode of the driving transistor. Other switch transistors are similar thereto and thus will no longer be described one by one here.

In the related art known by the inventors, there is a 7T1C pixel compensation circuit. However, the 7T1C pixel driving circuit uses seven signal lines, in addition to using seven transistors and one capacitor. With the development of the OLED technology, the space for each pixel becomes smaller and smaller, and it is more and more difficult for such a pixel to arrange so many TFTs (thin film transistors) and signal lines. The pixel driving circuit of the embodiment of the present disclosure (for example as shown in FIG. 2) reduces the number of the transistors and the signal lines, thereby reducing the space of the pixel.

Figure 3:
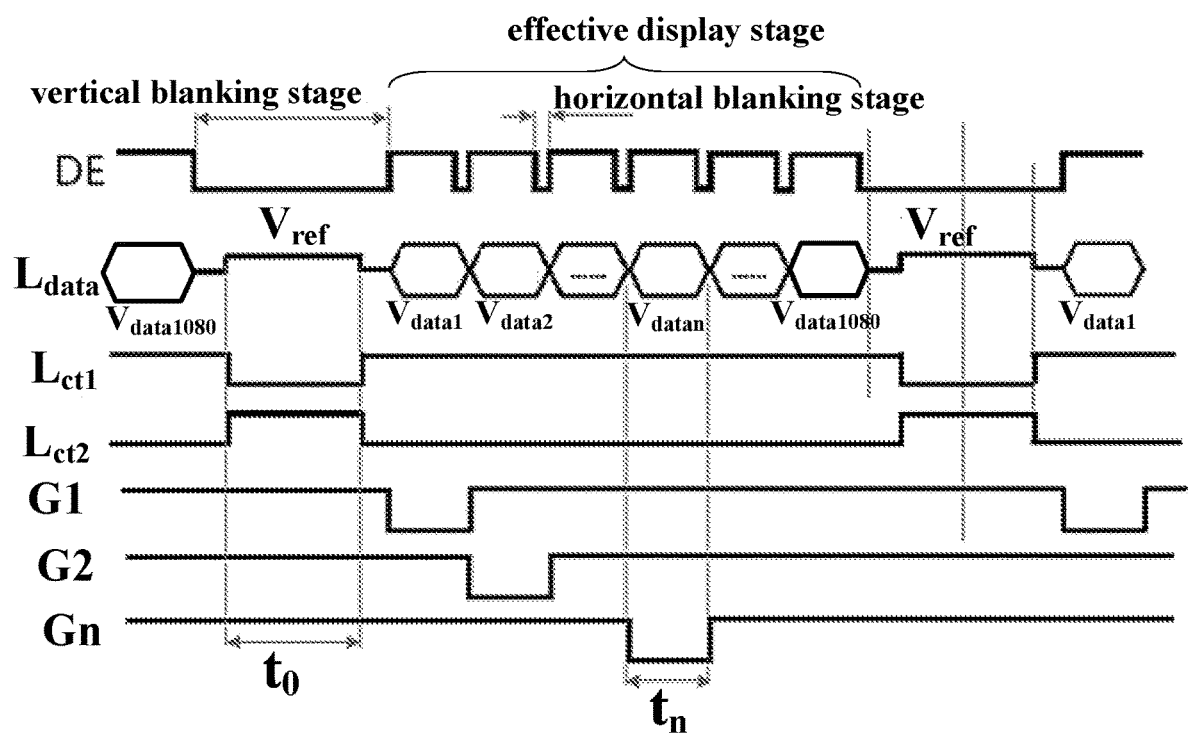
FIG. 3 is a timing control diagram illustrating a pixel driving circuit according to some embodiments of the present disclosure.

FIG. 3 is a timing control diagram illustrating a pixel driving circuit according to some embodiments of the present disclosure. The process of driving the light emitting element by the pixel driving circuit to emit light according to some embodiments of the present disclosure will be described in detail below in combination with FIGS. 2 and 3. Here, it is exemplified for illustration that the driving transistor T0, the first switch transistor T1, the second switch transistor T2, the third switch transistor T3, the fourth switch transistor T4, and the fifth switch transistor T5 are all PMOS transistors.

It should be noted that, the DE signal in FIG. 3 is an active-high signal (That is, the DE signal is active when it is high level) for the display device, and the timing control signals of G1, G2, and Gn in FIG. 3 are respectively gate voltage signals of the gate lines of the first row, the second row and the $n^{th}$ row of pixel driving circuits. FIG. 2 only shows one pixel driving circuit of the $n^{th}$ row, and the case is similar in other rows of driving circuits.

During the vertical blanking stage, specifically, at the $t_0$ stage (i.e., the threshold voltage establishing stage), $L_{ct1}$ is a low level (e.g., −7V), $L_{ct2}$ is a high level (e.g., 7V), and Gn is a high level. Correspondingly, the first switch transistor T1 and the second switch transistor T2 are turned on, and the third switch transistor T3, the fourth switch transistor T4 and the fifth switch transistor T5 are turned off. In this case, the driving transistor T0 and the light emitting element 14 are interrupted, and the first capacitor C1 and the second capacitor C2 are interrupted. The data line $L_{data}$ provides the reference level $V_{ref}$, which is written to the second terminal 112 of the first capacitor C1 by the second switch transistor T2.

At this stage $t_0$, since the first switch transistor T1 is turned on, the driving transistor T0 and the first switch transistor T1 constitute one equivalent diode, so that the voltage $ELV_{DD}$ of the first voltage terminal and the threshold voltage $V_{th}$ of the driving transistor ($V_{th}$ is a negative value for the PMOS transistor) are written to the first terminal 111 of the first capacitor C1. On both sides of the first capacitor C1, the voltage at the point A is the reference level $V_{ref}$, and the voltage at the point B is $ELV_{DD}+V_{th}$, so that the voltage difference saved on the first capacitor C1 is $ELV_{DD}+V_{th}-V_{ref}$. During the stage, the threshold voltage $V_{th}$ and the reference level $V_{ref}$ are written to the first capacitor.

At the end of the $t_0$ stage and before the effective display stage, $L_{ct2}$ is a low level and $L_{ct1}$ is a high level. Accordingly, the first switch transistor T1 and the second switch transistor T2 are turned off, and the third switch transistor T3 and the fifth switch transistor T5 are turned on.

In one case, if the second capacitor C2 saves the data level $V_{data-origin}$ of the previous frame of image at this time, the voltage $V_A$ at the point A is $V_{data-origin}$. Since the voltage difference saved on the first capacitor C1 is $ELV_{SS}+V_{th}-V_{ref}$, the voltage $V_B$ at the point B is $V_B=ELV_{DD}+V_{th}-V_{ref}+V_{data-origin}$.

The gate source voltage (i.e., the voltage between the control electrode 100 and the first electrode 101) $V_{GS}$ of the driving transistor T0 is $V_{GS}=V_B-ELV_{DD}=V_{th}-V_{ref}+V_{data-orgin}$.

Then, the driving current $I_{DS1}$ output from the driving transistor T0 is $$I_{DS1} = \frac{1}{2}\mu C_{OX} \frac{W}{L}(V_{GS}-V_{th})^2 = \frac{1}{2}\mu C_{OX} \frac{W}{L}(V_{data-orgin}-V_{ref})^2,$$

in which, μ is an effective carrier mobility, $C_{OX}$ is a capacitance of the driving transistor, W/L is a width to length ratio of the driving transistor, and μ, $C_{OX}$ and W/L are all known parameters.

That is, in the case that the second capacitor saves the data level $V_{data\text{-}orgin}$ of the previous frame of image, the driving transistor T0 outputs the driving current $I_{DS1}$ to the light emitting element after the end of the $t_0$ stage and before the effective display stage, so that the light emitting element emits light. However, since the light emitting element emits light using the data level $V_{data\text{-}orgin}$ of the previous frame of image, the data of the previous frame of image will be displayed at this time.

In another case, if the second capacitor does not save the data level at this time (for example the image to be displayed next is the first frame of image, and thus the second capacitor does not currently save the data level), the light emitting element will not emit light.

During the effective display stage, the data line $L_{data}$ provides the data level. For example, the data line sequentially outputs the first row, the second row ... the $n^{th}$ row of data level. During the effective display stage, $L_{ct1}$ is a high level and $L_{ct2}$ is a low level. The first switch transistor T1 and the second switch transistor T2 are turned off, and the third switch transistor T3 and the fifth switch transistor T5 are turned on. At this time, the voltage difference between both terminals of the first capacitor C1 maintains $ELV_{DD} + V_{th} - V_{ref}$.

At the $t_n$ stage, the gate voltage signal output from the $n^{th}$ gate line Gn is a low level, and thus the fourth switch transistor T4 is turned on. The $n^{th}$ data level $V_{datan}$ is written to the second terminal 122 of the second capacitor C2. That is, the second terminal 122 of the second capacitor C2 is refreshed to $V_{datan}$. At this time, the voltage $V_A$ at the point A is $V_{datan}$, and the voltage $V_B$ at the point B is $V_B = ELV_{DD} + V_{th} - V_{ref} + V_{datan}$.

The gate source voltage $V_{GS}$ of the driving transistor T0 is $V_{GS} = V_B - ELV_{DD} = V_{th} - V_{ref} + V_{datan}$.

Thus, the driving current $I_{DS}$ output from the driving transistor T0 is $$I_{DS} = \frac{1}{2}\mu C_{OX}\frac{W}{L}(V_{GS} - V_{th})^2 = \frac{1}{2}\mu C_{OX}\frac{W}{L}(V_{datan} - V_{ref})^2.$$

As can be seen from the expression of the driving current $I_{DS}$, the driving current $I_{DS}$ is no longer affected by the signals of the threshold voltage $V_{th}$ and the power supply voltage $ELV_{DD}$, so that the occurrence of the phenomenon of uneven brightness can be relieved when the image is displayed.

It should be noted that, since the second capacitor C2 saves the data level $V_{datan}$, during the effective display stage, in the remaining time after the data level $V_{datan}$ is written, the light emitting elements of the row of pixel driving circuits keep emitting light until the beginning of the $t_0$ stage during the next vertical blanking stage.

In the above embodiment, the light emitting element does not emit light during the $t_0$ stage, and the light emitting element emits light during other stages than the $t_0$ stage. In some embodiments, the duration time of the reference level $V_{ref}$ (i.e., the duration time of the $t_0$ stage) is shorter than the duration time of the vertical blanking stage, so that the normal light-emitting time of the light emitting element is increased. However, in other embodiments, the duration time of the reference level $V_{ref}$ is equal to the duration time of the vertical blanking stage. Therefore, the scope according to the embodiment of the present disclosure is not limited thereto.

In some embodiments, the pixel driving circuit dose not comprises the fifth switch transistor T5. In the above-mentioned timing control process, during the $t_0$ stage, the driving transistor T0 and the first switch transistor T1 constitute one equivalent diode, so that there will be current flowing through the light emitting element, which causes that the light emitting element emits light abnormally. However, the time of the vertical blanking stage is much less than the time of the effective display stage. For example, the time of the vertical blanking stage is 20 rows of scan time, and the time of the effective display stage is 1080 rows of scan time. Therefore, during the $t_0$ stage, the time for abnormal light emission of the light emitting element is much less than the time for normal light emission during the display effective stage. In this way, in the display process of each frame of image, the abnormal light emission is basically not discerned visually. Therefore, to some extent, in the case that the pixel driving circuit does not include the fifth switch transistor, the image display is not affected. Also, a pixel driving circuit that does not comprise the fifth switch transistor reduces one switch transistor, thereby reducing the space of the pixel.

In other embodiments of the present disclosure, the first switch transistor and the second switch transistor have a first conductive type; and the third switch transistor has a second conductive type opposite to the first conductive type. The at least one control line is configured to provide the same control signal to the gates of the first switch transistor, the second switch transistor and the third switch transistor. In this case, The number of control lines of such a pixel driving circuit is one less than the number of control lines of the pixel driving circuit shown in FIG. 2.

In other embodiments of the present disclosure, in the case that the pixel driving circuit further comprises a fifth switch transistor, the first switch transistor and the second switch transistor have a first conductive type; and the third switch transistor and the fifth switch transistor have a second conductive type opposite to the first conductive type. The at least one control line is configured to provide the same control signal to the gates of the first switch transistor, the second switch transistor, the third switch transistor and the fifth switch transistor. In this case, The number of control lines of such a pixel driving circuit is one less than the number of control lines of the pixel driving circuit shown in FIG. 2.

Such embodiments will be described below in combination with FIGS. 4 and 5, respectively.

Figure 4:
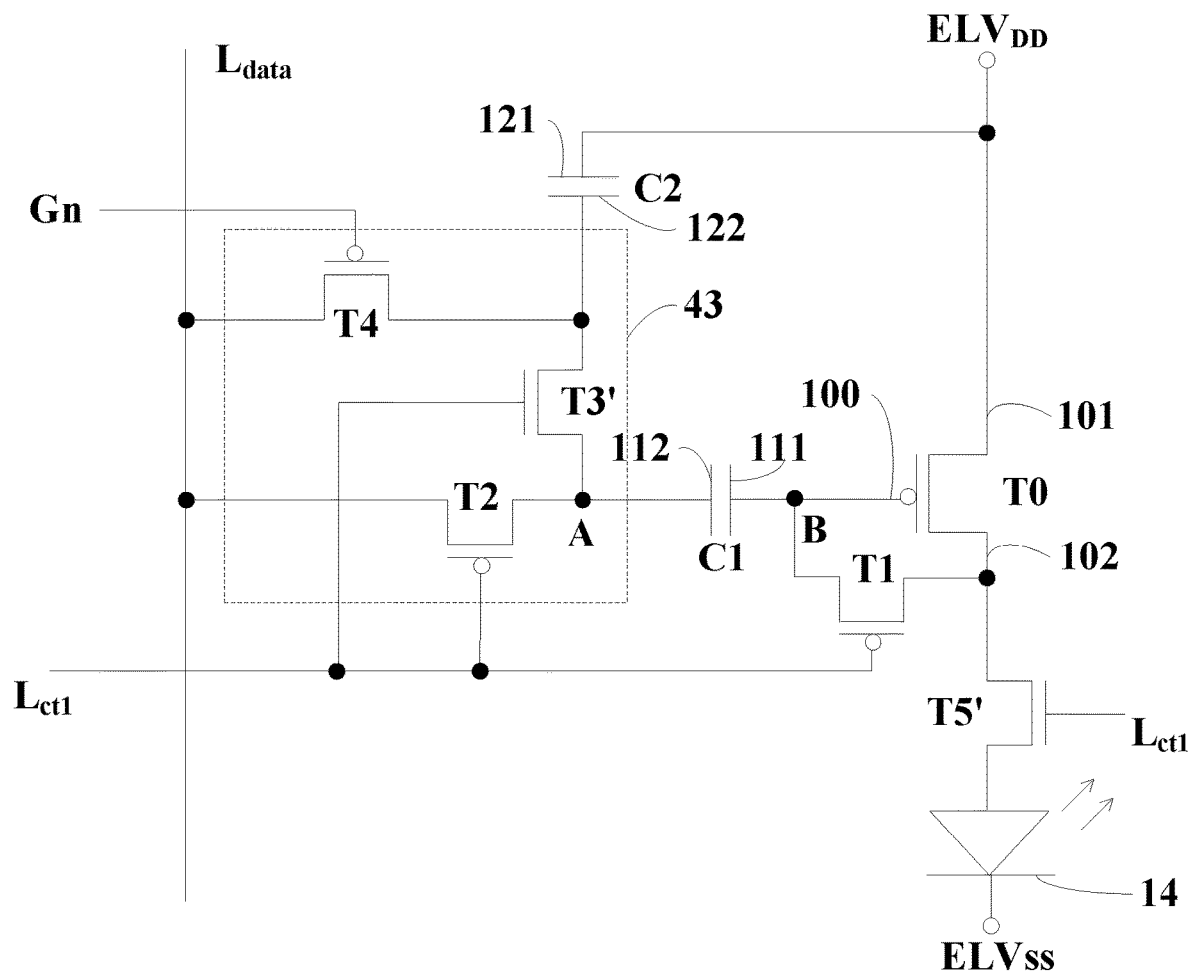
FIG. 4 is a circuit connection diagram illustrating a pixel driving circuit according to further embodiments of the present disclosure.

FIG. 4 is a circuit connection diagram illustrating a pixel driving circuit according to further embodiments of the present disclosure.

The write circuit 43 shown in FIG. 4 differs from the write circuit 23 shown in FIG. 2 in that, the third switch transistor T3' in the write circuit 43 is an NMOS transistor. The gate of the third switch transistor T3' is electrically connected to the first control line $L_{ct1}$. As such, in FIG. 4, the first switch transistor T1 and the second switch transistor T2 are both PMOS transistors, and the third switch transistor T3' is an NMOS transistor. This causes the gates of the first switch transistor T1, the second switch transistor T2 and the third switch transistor T3' to be electrically connected to the first control line $L_{ct1}$. The first control line $L_{ct1}$ is configured to provide a timing control signal of the first control line $L_{ct1}$ as shown in FIG. 3.

In addition, the fifth switch transistor T5' in FIG. 4 is an NMOS transistor, and the gate of the fifth switch transistor T5' is also electrically connected to the first control line $L_{ct1}$.

In FIG. 4, the third switch transistor T3' and the fifth switch transistor T5' are both controlled by the timing signal of the first control line $L_{ct1}$.

The driving process of the pixel driving circuit shown in FIG. 4 is similar to the driving process of the pixel driving circuit shown in FIG. 2 described previously, and will not be repeated here. In this way, the pixel driving circuit shown in FIG. 4 achieves the driving effect that is the same as or similar to the pixel driving circuit shown in FIG. 2. However, the pixel driving circuit shown in FIG. 4 may reduce one second control line than the pixel driving circuit shown in FIG. 2, thereby reducing the space of the pixel.

Figure 5:
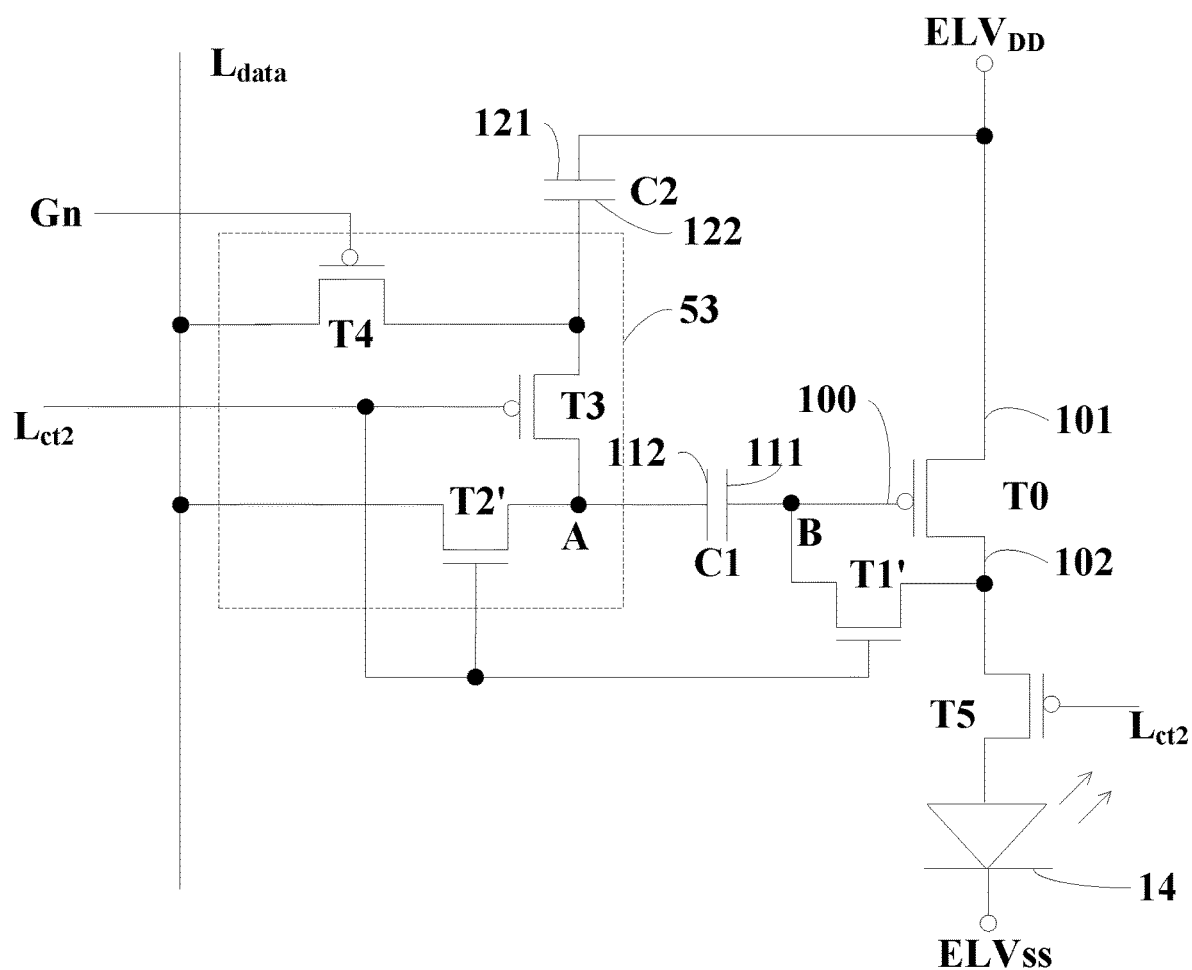
FIG. 5 is a circuit connection diagram illustrating a pixel driving circuit according to further embodiments of the present disclosure.

FIG. 5 is a circuit connection diagram illustrating a pixel driving circuit according to further embodiments of the present disclosure.

The write circuit 53 shown in FIG. 5 differs from the write circuit 23 shown in FIG. 2 in that, the second switch transistor T2' in the write circuit 53 is an NMOS transistor. The gate of the second switch transistor T2' is electrically connected to the second control line $L_{ct2}$. In addition, the first switch transistor T1' is also an NMOS transistor. The gate of the first switch transistor T1' is also electrically connected to the second control line $L_{ct2}$. Thus, in FIG. 5, the first and second switch transistors T1' and T2' are both NMOS transistors, and the third switch transistor T3 is a PMOS transistor. This causes the gates of the first switch transistor T1', the second switch transistor T2' and the third switch transistor T3 to be electrically connected to the second control line $L_{ct2}$. The second control line $L_{ct2}$ is configured to provide a timing control signal of the second control line $L_{ct2}$ as shown in FIG. 3.

In addition, the fifth switch transistor T5 in FIG. 5 may be a PMOS transistor. The gate of the fifth switch transistor T5 is electrically connected to the second control line $L_{ct2}$.

In FIG. 5, the first switch transistor T1' and the second switch transistors T2' are both controlled by a timing signal of the second control line $L_{ct2}$. The driving process of the pixel driving circuit shown in FIG. 5 is similar to the driving process of the pixel driving circuit shown in FIG. 2 described previously, and will not be repeated here. In this way, the pixel driving circuit shown in FIG. 5 achieves the driving effect that is the same as or similar to the pixel driving circuit shown in FIG. 2. However, the pixel driving circuit shown in FIG. 5 reduces one first control line than the pixel driving circuit shown in FIG. 2, thereby reducing the space of the pixel.

It should be noted that, although each of the pixel driving circuits shown in FIG. 4 and FIG. 5 comprise the fifth switch transistor, those skilled in the art might understand from the foregoing description that, the pixel driving circuits in FIG. 4 and FIG. 5 may not comprise the fifth switch transistor, so as to reduce one switch transistor, thereby reducing the space of the pixel.

Figure 6:
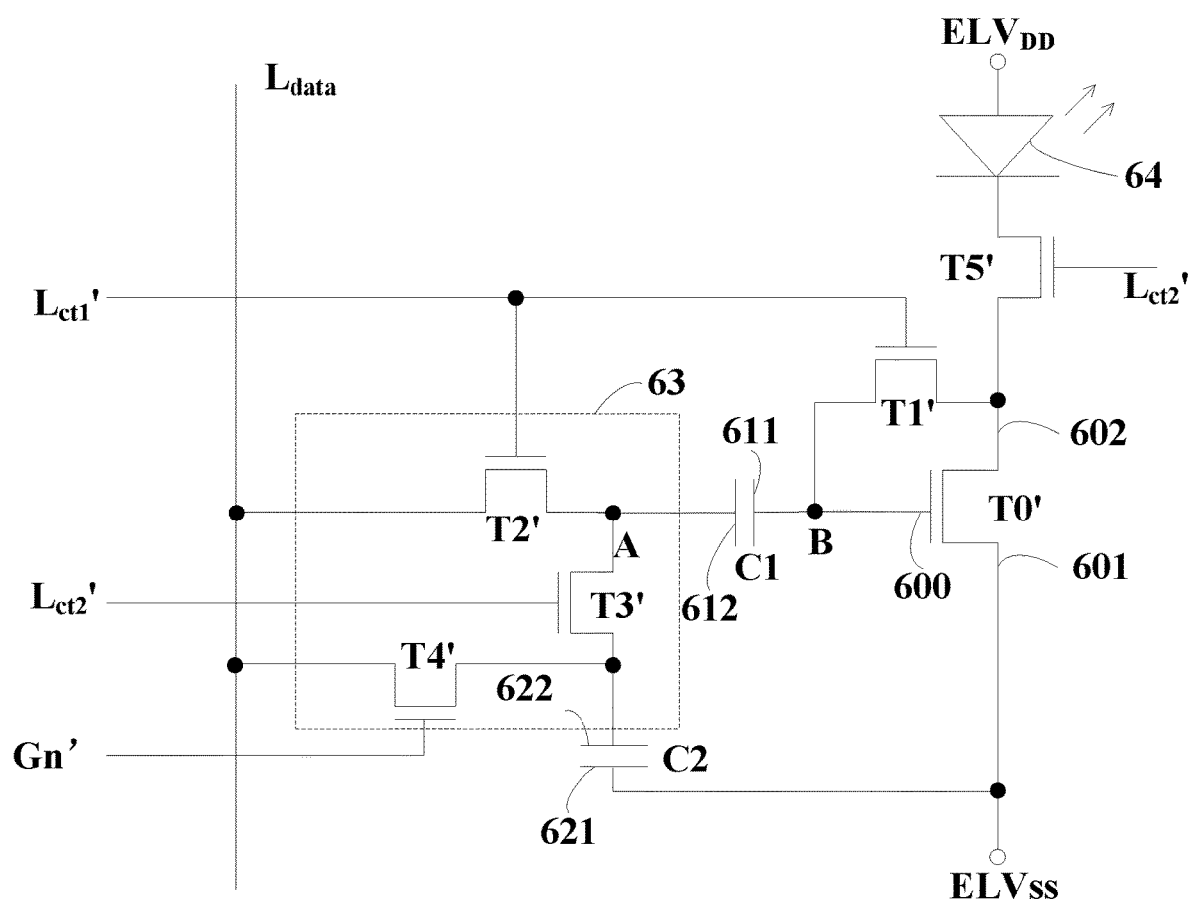
FIG. 6 is a circuit connection diagram illustrating a pixel driving circuit according to further embodiments of the present disclosure.

FIG. 6 is a circuit connection diagram illustrating a pixel driving circuit according to further embodiments of the present disclosure.

In some embodiments, as shown in FIG. 6, the driving transistor T' may be an NMOS transistor. The control electrode 600, the first electrode 601 and the second electrode 602 of the driving transistor are respectively the gate, the source and the drain of the NMOS transistor. The first voltage terminal is the ground terminal $ELV_{SS}$, and the second voltage terminal is the power supply voltage terminal $ELV_{DD}$.

As shown in FIG. 6, in the pixel driving circuit, the first electrode 601 of the driving transistor T0' is electrically connected to the first voltage terminal (for example, the ground terminal $ELV_{SS}$), and the control electrode 600 of the driving transistor T0' is electrically connected to the first terminal 611 of the first capacitor C1. The light emitting element (e.g., OLED) 64 is disposed between the second electrode 602 of the driving transistor T0' and the second voltage terminal (e.g., the power supply voltage terminal $ELV_{DD}$). The second terminal 612 of the first capacitor C1 is electrically connected to the write circuit 63. The first terminal 621 of the second capacitor C2 is electrically connected to the first voltage terminal (e.g., the ground terminal $ELV_{SS}$). The second terminal 622 of the second capacitor C2 is electrically connected to the write circuit 63. Here, in the case that the driving transistor is an NMOS transistor, the first terminal of the second capacitor C2 is electrically connected to the ground terminal, which facilitates the manufacture of the circuit. In other embodiments, the first terminal of the second capacitor C2 is electrically connected to the second voltage terminal (e.g., the power supply voltage terminal $ELV_{DD}$).

As shown in FIG. 6, in the pixel driving circuit, the first switch transistor T1' is electrically connected between the control electrode 600 and the second electrode 602. The gate of the first switch transistor T1' is electrically connected to the first control line $L_{ct1}$'.

In some embodiments, as shown in FIG. 6, the write circuit 63 may comprise: a second switch transistor T2' electrically connected between the second terminal 612 of the first capacitor C1 and the data line $L_{data}$, a third switch transistor T3' electrically connected between the second terminal 612 of the first capacitor C1 and the second terminal 622 of the second capacitor C2, and a fourth switch transistor T4' electrically connected between the data line $L_{data}$ and the second terminal 622 of the second capacitor C2.

In some embodiments, a first control line $L_{ct1}$ and a second control line $L_{ct2}$' are shown in FIG. 6. The first control line $L_{ct1}$ is configured to provide the first control signal to the gate of the first switch transistor T1' and the gate of the second switch transistor T2'. The second control line $L_{ct2}$' is configured to provide the second control signal to the gate of the third switch transistor T3'. The level of the second control signal is opposite to that of the first control signal.

In FIG. 6, the first switch transistor T1', the second switch transistor T2' and the third switch transistor T3' are all NMOS transistors. In addition, the fourth switch transistor T4' is also an NMOS transistor. The gate line Gn' provides the gate voltage signal to the gate of the fourth switch transistor T4'.

In some embodiments, as shown in FIG. 6, the pixel driving circuit further comprises a fifth switch transistor T5'. The fifth switch transistor T5' is electrically connected between the second electrode 602 of the driving transistor T0' and the light emitting element 64. For example, the fifth switch transistor T5' is an NMOS transistor. The gate of the fifth switch transistor T5' is electrically connected to the second control line $L_{ct2}$'.

Figure 7:
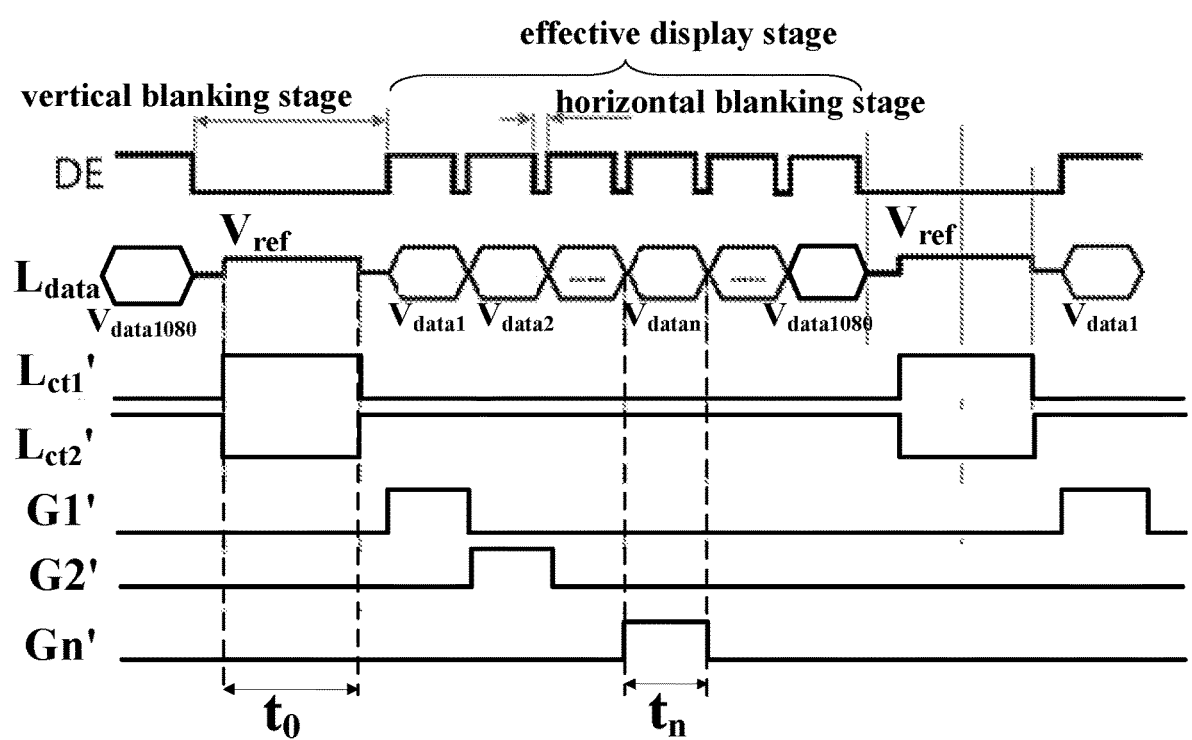
FIG. 7 is a timing control diagram illustrating a pixel driving circuit according to further embodiments of the present disclosure.

FIG. 7 is a timing control diagram illustrating a pixel driving circuit according to further embodiments of the present disclosure. The process of driving the light emitting element by the pixel driving circuit to emit light according to some embodiments of the present disclosure will be described in detail below in combination with FIGS. 6 and 7. Here, it is exemplified for illustration that the driving transistor T0', the first switch transistor T1', the second switch transistor T2', the third switch transistor T3', the fourth switch transistor T4', and the fifth switch transistor T5' are all NMOS transistors.

It should be noted that, the DE signal in FIG. 6 is an active-high signal for the display device, and the timing control signals of G1', G2', and Gn' in FIG. 7 are respectively gate voltage signals of the gate lines of the first row, the second row and the $n^{th}$ row of pixel driving circuits, and n is a positive integer. FIG. 6 only shows one pixel driving circuit of the $n^{th}$ row, and the case is similar in other rows of driving circuits.

During the vertical blanking stage, specifically, at the $t_0$ stage, $L_{ct1}'$ is a high level, $L_{ct2}'$ is a low level, and Gn' is a low level. Correspondingly, the first switch transistor T1' and the second switch transistor T2' are turned on, and the third switch transistor T3', the fourth switch transistor T4' and the fifth switch transistor T5' are turned off. In this case, the driving transistor T0' and the light emitting element 64 are interrupted, and the first capacitor C1 and the second capacitor C2 are interrupted. The data line $L_{data}$ provides a reference level $V_{ref}$ which is written to the second terminal 612 of the first capacitor C1 by the second switch transistor T2'.

At this stage $t_0$, since the first switch transistor T1' is turned on, the driving transistor T0' and the first switch transistor T1' may constitute one equivalent diode. This causes the voltage $ELV_{SS}$ of the first voltage terminal and the threshold voltage $V_{th}$ of the driving transistor ($V_{th}$ is a positive value for the NMOS transistor) to be written to the first terminal 611 of the first capacitor C1. On both sides of the first capacitor C1, the voltage at the point A is the reference level $V_{ref}$, and the voltage at the point B is $ELV_{SS}+V_{th}$, so that the voltage difference saved on the first capacitor C1 is $ELV_{SS}+V_{th}-V_{ref}$. During the stage, the threshold voltage $V_{th}$ and the reference level $V_{ref}$ are written to the first capacitor C1.

At the end of the $t_0$ stage and before the effective display stage, $L_{ct2}'$ is a high level and $L_{ct1}'$ is a low level. The first switch transistor T1' and the second switch transistor T2' are turned off, and the third switch transistor T3' and the fifth switch transistor T5' are turned on.

In one case, if the second capacitor C2 saves the data level $V_{data\text{-}origin}$ of the previous frame of image at this time, the voltage $V_A$ at the point A is $V_{data\text{-}orgin}$. Since the voltage difference saved on the first capacitor C1 is $ELV_{SS}+V_{th}-V_{ref}$, the voltage $V_B$ at the point B is $V_B=ELV_{SS}+V_{th}-V_{ref}+V_{data\text{-}origin}$.

The gate source voltage (i.e., the voltage between the control electrode 600 and the first electrode 601) $V_{GS}$ of the driving transistor T0' is $V_{GS}=V_B-ELV_{SS}=V_{th}-V_{ref}+V_{data\text{-}orgin}$.

Then, the driving current $I_{DS1}$ output from the driving transistor T0' is $$I_{DS1} = \frac{1}{2}\mu C_{OX}\frac{W}{L}(V_{GS}-V_{th})^2 = \frac{1}{2}\mu C_{OX}\frac{W}{L}(V_{data\text{-}orgin}-V_{ref})^2.$$

in which, μ is an effective carrier mobility, $C_{OX}$ is a capacitance of the driving transistor, W/L is a width to length ratio of the driving transistor, and μ, $C_{OX}$ and W/L are all known parameters.

That is, in the case that the second capacitor saves the data level $V_{data\text{-}orgin}$ of the previous frame of image, after the end of the $t_0$ stage and before the effective display stage, the driving transistor T0' outputs the driving current $I_{DS1}$ to the light emitting element, so that the light emitting element emits light. However, since the light emitting element emits light using the data level $V_{data\text{-}origin}$ of the previous frame of image, the data of the previous frame of image will be displayed at this time.

In another case, if the second capacitor does not save the data level at this time (for example the image to be displayed next is the first frame of image, and thus the second capacitor does not currently save the data level), the light emitting element will not emit light.

During the effective display stage, the data line $L_{data}$ provides the data level. For example, the data line sequentially outputs the first row, the second row . . . the $n^{th}$ row of data level. During the effective display stage, $L_{ct1}'$ is a low level and $L_{ct2}'$ is a high level. The first switch transistor T1' and the second switch transistor T2' are turned off, and the third switch transistor T3' and the fifth switch transistor T5' are turned on. At this time, the voltage voltage voltage difference between both terminals of the first capacitor C1 maintains $ELV_{SS}+V_{th}-V_{ref}$.

At the $t_n$ stage, the gate voltage signal output from the $n^{th}$ gate line Gn' is a high level, which causes that the fourth switch transistor T4' is turned on. The $n^{th}$ data level $V_{datan}$ is written to the second terminal 622 of the second capacitor C2. That is, the second terminal 622 of the second capacitor C2 is refreshed to $V_{datan}$. At this time, the voltage $V_A$ at the point A is $V_{datan}$, and the voltage $V_B$ at the point B is $V_B=ELV_{SS}+V_{th}-V_{ref}+V_{datan}$.

The gate source voltage $V_{GS}$ of the driving transistor T0' is $V_{GS}=V_B-ELV_{SS}=V_{th}-V_{ref}+V_{datan}$.

Thus, the driving current $I_{DS}$ output from the driving transistor T0' is $$I_{DS} = \frac{1}{2}\mu C_{OX}\frac{W}{L}(V_{GS}-V_{th})^2 = \frac{1}{2}\mu C_{OX}\frac{W}{L}(V_{datan}-V_{ref})^2.$$

As can be seen from the expression of the driving current $I_{DS}$, the driving current $I_{DS}$ is no longer affected by the signals of the threshold voltage $V_{th}$ and the power supply voltage $ELV_{DD}$, so that the occurrence of the phenomenon of uneven brightness is relieved when the image is displayed.

Figure 8:
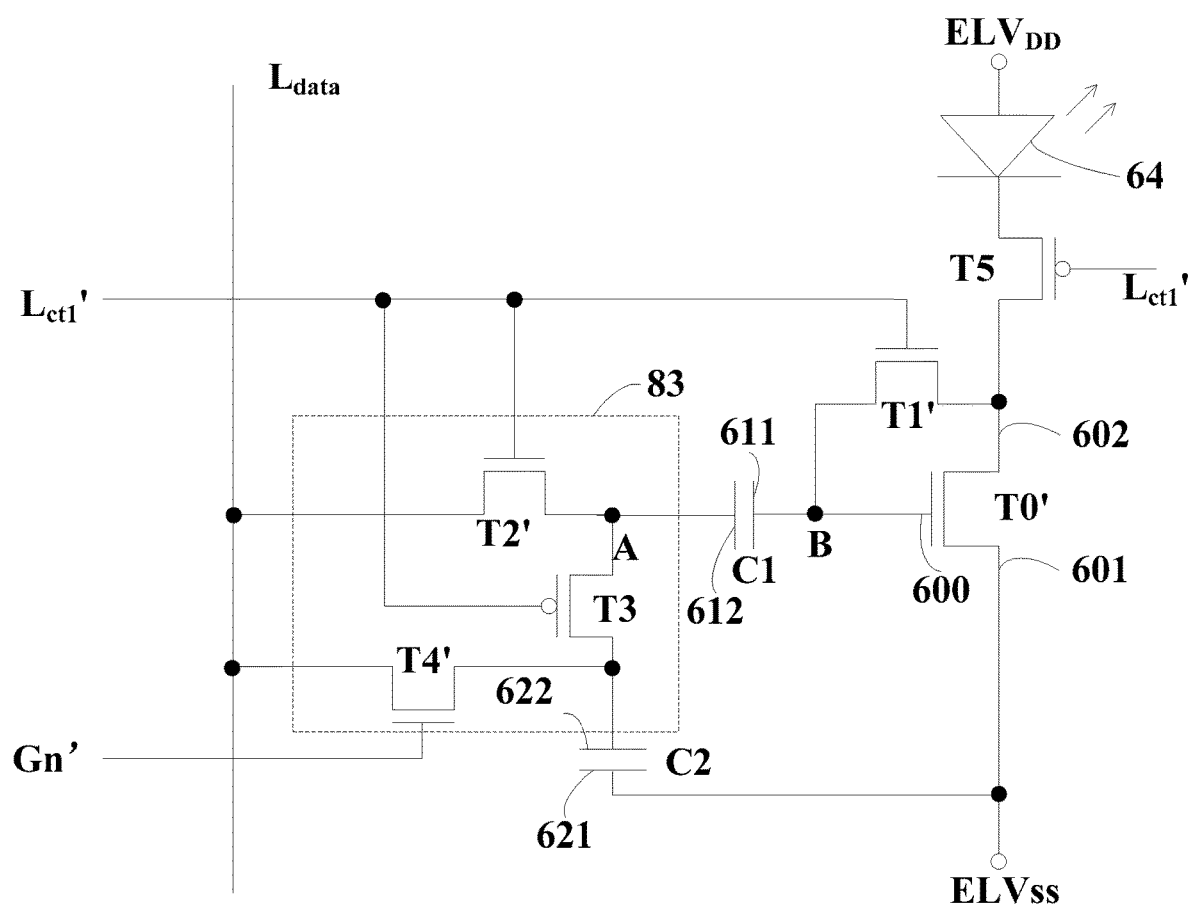
FIG. 8 is a circuit connection diagram illustrating a pixel driving circuit according to further embodiments of the present disclosure.

FIG. 8 is a circuit connection diagram illustrating a pixel driving circuit according to further embodiments of the present disclosure.

The write circuit 83 shown in FIG. 8 differs from the write circuit 63 shown in FIG. 6 in that, the third switch transistor T3 in the write circuit 83 is a PMOS transistor. The gate of the third switch transistor T3 is electrically connected to the first control line $L_{ct1}'$. Thus, in FIG. 8, the first and second switch transistors T1' and T2' are both NMOS transistors, and the third switch transistor T3 is a PMOS transistor. This causes the gates of the first switch transistor T1', the second switch transistor T2' and the third switch transistor T3 to be electrically connected to the first control line $L_{ct1}'$. The first control line $L_{ct1}'$ is configured to provide a timing control signal of the first control line $L_{ct1}'$ as shown in FIG. 7.

In addition, the fifth switch transistor T5 in FIG. 8 is a PMOS transistor, and the gate of the fifth switch transistor T5 is also electrically connected to the first control line $L_{ct1}'$. In FIG. 8, the third switch transistor T3 and the fifth switch transistor T5 are controlled by the timing signal of the first control line Lct1'.

The driving process of the pixel driving circuit shown in FIG. 8 is similar to the driving process of the pixel driving circuit shown in FIG. 6 described previously, and will not be repeated here. In this way, the pixel driving circuit shown in FIG. 8 achieves the driving effect that is the same as or similar to the pixel driving circuit shown in FIG. 6. However, compared with the pixel driving circuit shown in FIG. 6, the pixel driving circuit shown in FIG. 8 does not include the second control line, thereby reducing the space of the pixel.

Figure 9:
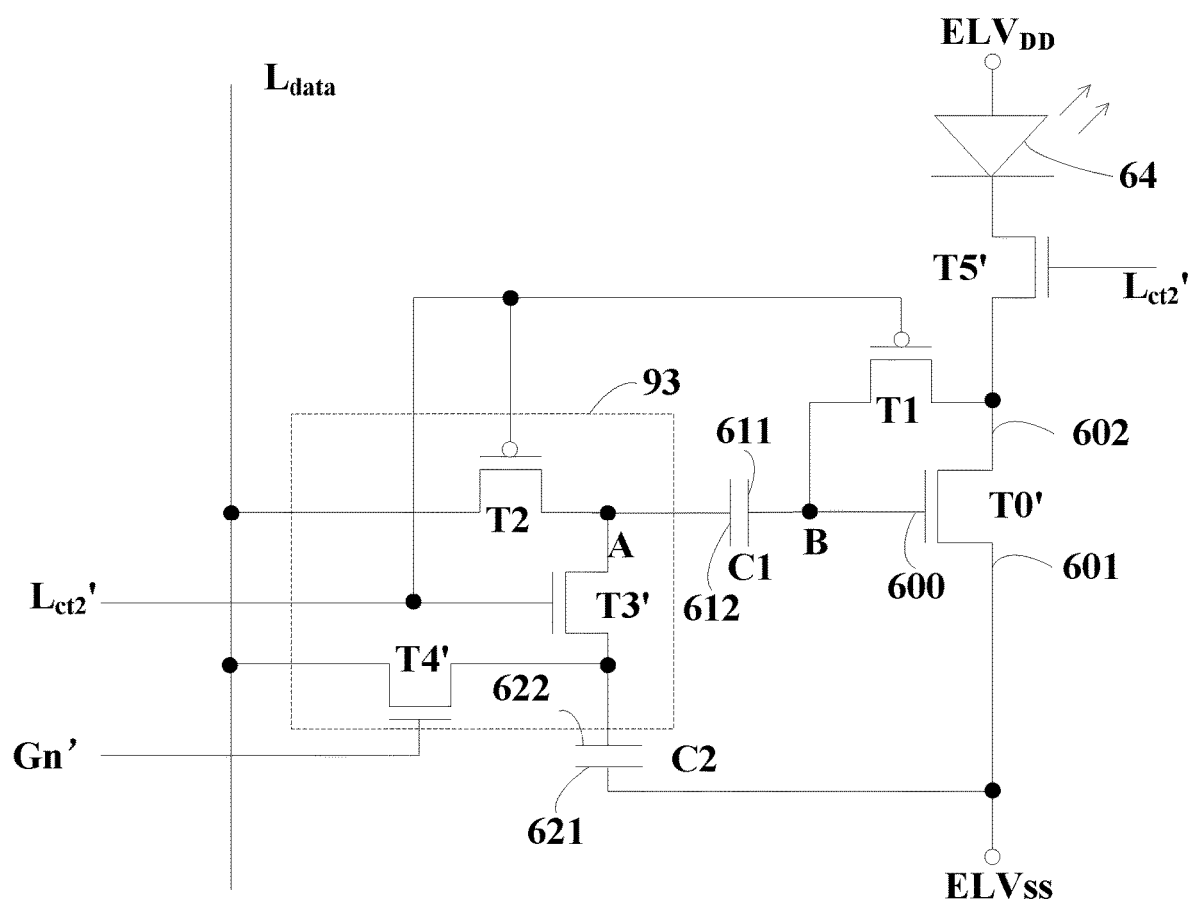
FIG. 9 is a circuit connection diagram illustrating a pixel driving circuit according to further embodiments of the present disclosure.

FIG. 9 is a circuit connection diagram illustrating a pixel driving circuit according to further embodiments of the present disclosure.

The write circuit 93 shown in FIG. 9 differs from the write circuit 63 shown in FIG. 6 in that, the second switch transistor T2 in the write circuit 93 is a PMOS transistor. The gate of the second switch transistor T2 is electrically connected to the second control line $L_{ct2}'$. In addition, the first switch transistor T1 is also a PMOS transistor. The gate of the first switch transistor T1 is also electrically connected to the second control line $L_{ct2}'$. As such, in FIG. 9, the first switch transistor and the second switch transistor T1 and T2 are both PMOS transistors, and the third switch transistor T3' is an NMOS transistor. This causes the gates of the first switch transistor T1, the second switch transistor T2 and the third switch transistor T3' to be electrically connected to the second control line $L_{ct2}'$. The second control line $L_{ct2}'$ is configured to provide a timing control signal of the second control line $L_{ct2}'$ as shown in FIG. 7.

In addition, the fifth switch transistor T5' in FIG. 9 is an NMOS transistor. The gate of the fifth switch transistor T5' is electrically connected to the second control line $L_{ct2}'$.

In FIG. 9, the first switch transistor T1 and the second switch transistors T2 are both controlled by the timing signal of the second control line $L_{ct2}'$. The driving process of the pixel driving circuit shown in FIG. 9 is similar to the driving process of the pixel driving circuit shown in FIG. 6 described previously, and will not be repeated here. In this way, the pixel driving circuit shown in FIG. 9 achieves the driving effect that is the same as or similar to the pixel driving circuit shown in FIG. 6. However, compared with the pixel driving circuit shown in FIG. 6, the pixel driving circuit shown in FIG. 9 does not include the first control line, thereby reducing the space of the pixel.

It should be noted that, each of the pixel driving circuits shown in FIG. 8 and FIG. 9 comprise the fifth switch transistor. However, those skilled in the art understand from the foregoing description that, the pixel driving circuits in FIG. 8 and FIG. 9 may not comprise the fifth switch transistor, so that it is possible to reduce one switch transistor, thereby reducing the space of the pixel.

Figure 10:
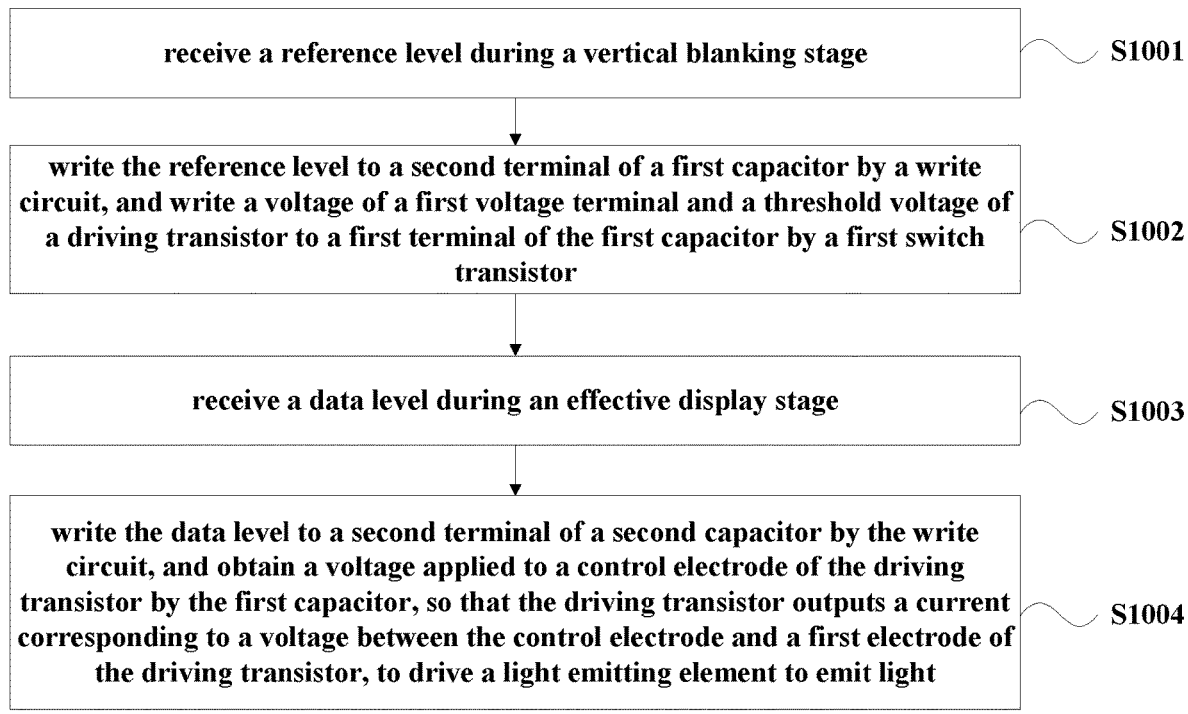
FIG. 10 is a flowchart illustrating a driving method for a pixel driving circuit according to some embodiments of the present disclosure.

FIG. 10 is a flowchart illustrating a driving method for a pixel driving circuit according to some embodiments of the present disclosure.

In the step S1001, receive a reference level during a vertical blanking stage. For example, receive the reference level at the $t_0$ stage during the vertical blanking stage.

In the step S1002, write the reference level to a second terminal of a first capacitor by a write circuit, and write a voltage of a first voltage terminal and a threshold voltage of a driving transistor to a first terminal of the first capacitor by a first switch transistor.

In the step S1003, receive a data level during an effective display stage.

In the step S1004, write the data level to a second terminal of a second capacitor by the write circuit, and obtain a voltage applied to a control electrode of the driving transistor by the first capacitor, so that the driving transistor outputs a current corresponding to a voltage between the control electrode and a first electrode of the driving transistor, to drive a light emitting element to emit light.

In the driving method for the pixel driving circuit of the aforementioned embodiments, during the vertical blanking stage, the reference level is written to the second terminal of the first capacitor by a write circuit, and the voltage of the first voltage terminal and the threshold voltage of the driving transistor are written to the first terminal of the first capacitor by the first switch transistor. During the effective display stage, the data level is written to the second terminal of the second capacitor by the write circuit. This causes that the driving current output from the driving transistor is no longer related to the threshold voltage of the driving transistor and the power supply voltage, and thus the driving current of the driving transistor is no longer affected by the threshold voltage and the power supply voltage, and the occurrence of the phenomenon of uneven brightness is relieved when the image is displayed.

In some embodiments of the present disclosure, the duration time of the reference level is shorter than that of the vertical blanking stage. This facilitates increasing the normal light-emitting time of the light emitting element.

Figure 11:
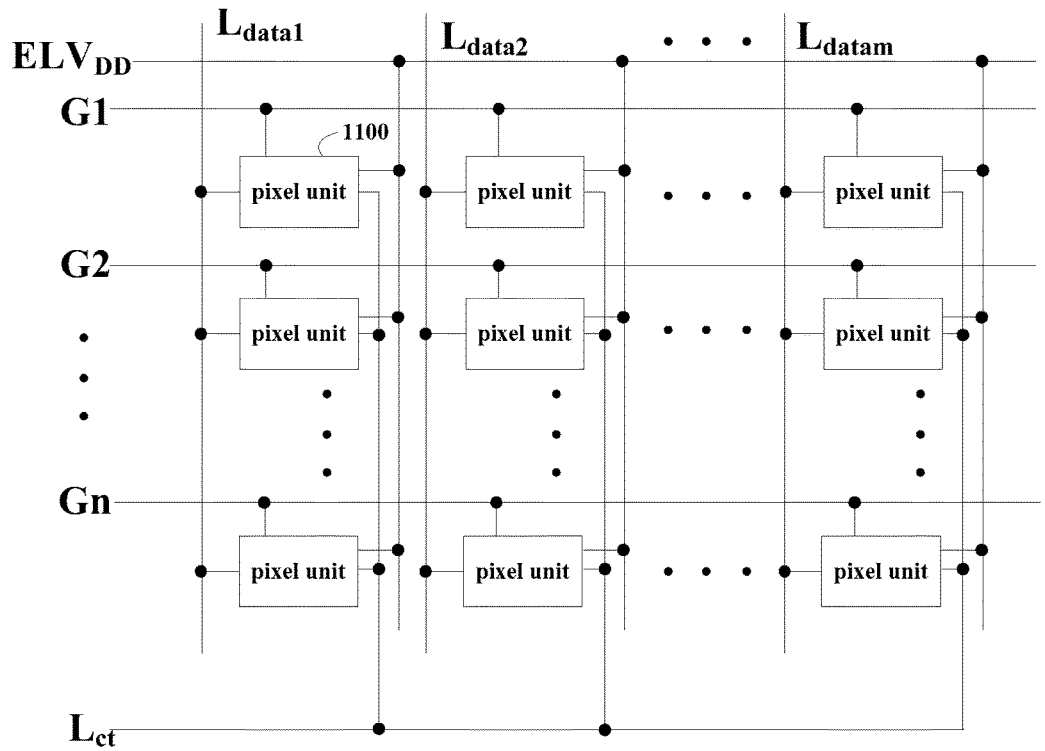
FIG. 11 is a circuit connection diagram illustrating a display device according to some embodiments of the present disclosure.

FIG. 11 is a circuit connection diagram illustrating a display device according to some embodiments of the present disclosure.

As shown in FIG. 11, the display device comprises a pixel arrays. The pixel array comprises a plurality of pixel units 1100. For example, n×m pixel units are shown in FIG. 11, where n and m are positive integers. Each pixel unit 1100 comprises the pixel driving circuit as described above, such as the pixel driving circuit shown in FIG. 1, FIG. 2, FIG. 4, FIG. 5, FIG. 6, FIG. 8 or FIG. 9.

As shown in FIG. 11, the display device further comprises at least one control line $L_{ct}$ electrically connected to the pixel driving circuit of each of the pixel units. In some embodiments, the at least one control line comprises two control lines, such as the first control line and the second control line as described above. In other embodiments, the at least one control line comprises one control line. For example, the control line is the first control line or is the second control line.

As shown in FIG. 11, the display device further comprises a plurality of data lines (e.g., the data line $L_{data1}$ to the data line $L_{datam}$). Each of the data lines is electrically connected with the pixel driving circuit of each of th pixel units in the same column of the pixel array. For example, the first data line $L_{data1}$ is electrically connected with the pixel driving circuit of each of the first column of pixel units, the $m^{th}$ data line $L_{datam}$ is electrically connected with the pixel driving circuit of each of the $m^{th}$ column of pixel units, and the like.

As shown in FIG. 11, the display device further comprise a plurality of gate lines (e.g., the gate lines G1 to Gn). Each of the gate lines is electrically connected with the pixel driving circuit of each of the pixel units in the same row of the pixel array. For example, the first gate line G1 is electrically connected with the pixel driving circuit of each of the first row of pixel units, the $n^{th}$ gate line Gn is electrically connected with the pixel driving circuit of each of the $n^{th}$ row of pixel units, and the like.

The display device according to the above embodiments comprises a plurality of pixel driving circuits as described above. In each pixel driving circuit, during the vertical blanking stage, the reference level from the data line is written to the second terminal of the first capacitor by the write circuit, and the voltage of the first voltage terminal and the threshold voltage of the driving transistor are written to the first terminal of the first capacitor by the first switch transistor. During the effective display stage, the data level from the data line is written to the second terminal of the second capacitor by the write circuit. This causes that the driving current output from the driving transistor of each pixel driving circuit is no longer related to the threshold voltage of the driving transistor and the power supply voltage, so that the driving current of each driving transistor is no longer affected by the threshold voltage and the power supply voltage, and the occurrence of the phenomenon of uneven brightness is relieved when the image is displayed by the display device.

In some embodiments, the display device further comprises a first power line and a second power line. The first power line is electrically connected to the first voltage terminal corresponding to the pixel driving circuit of each of the pixel units. The first power line is configured to provide the voltage of the first voltage terminal. The second power line is electrically connected to the second voltage terminal corresponding to the pixel driving circuit of each of the pixel units. The second power line is configured to provide the voltage of the second voltage terminal. For example, in the case that the driving transistor of the pixel driving circuit is a PMOS transistor, the first power line is the power supply voltage line $ELV_{DD}$ (as shown in FIG. 11), and the second power line is the ground line (not shown in FIG. 11). Also for example, in a case that the driving transistor of the pixel driving circuit is an NMOS transistor, the first power line is the ground line, and the second power line is the power supply voltage line.

Figure 12:
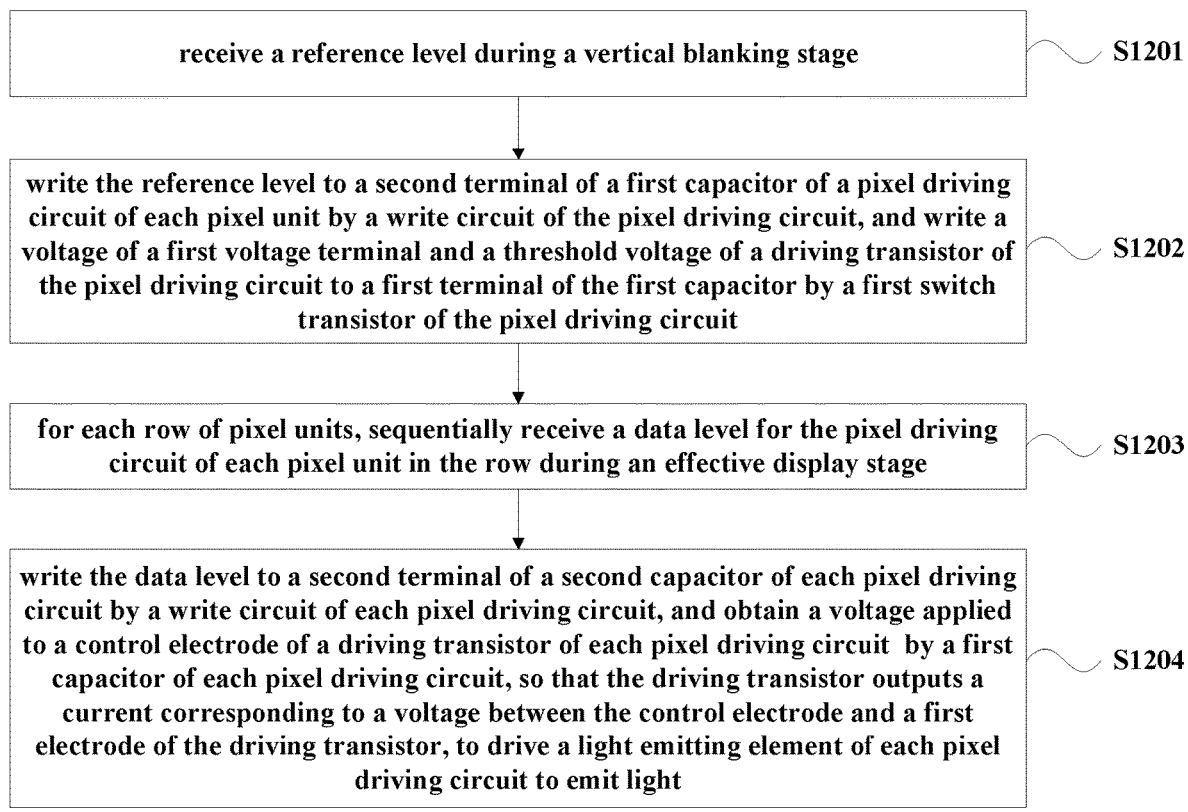
FIG. 12 is a flowchart illustrating a driving method for a display device according to some embodiments of the present disclosure.

FIG. 12 is a flowchart illustrating a driving method for a display device according to some embodiments of the present disclosure.

In the step S1201, receive a reference level during a vertical blanking stage. For example, receive the reference level at the $t_0$ stage during the vertical blanking stage.

In the step S1202, write the reference level to a second terminal of a first capacitor of a pixel driving circuit of each pixel unit by a write circuit of the pixel driving circuit, and write a voltage of a first voltage terminal and a threshold voltage of a driving transistor of the pixel driving circuit to a first terminal of the first capacitor by a first switch transistor of the pixel driving circuit.

In the step S1203, for each row of pixel units, sequentially receive a data level for the pixel driving circuit of each pixel unit in the row during an effective display stage.

In the step 1204, write the data level to a second terminal of a second capacitor of each pixel driving circuit by a write circuit of each pixel driving circuit, and obtain a voltage applied to a control electrode of a driving transistor of each pixel driving circuit by a first capacitor of each pixel driving circuit, so that the driving transistor outputs a current corresponding to a voltage between the control electrode and a first electrode of the driving transistor, to drive a light emitting element of each pixel driving circuit to emit light.

In the driving method for the display device according to the aforementioned embodiments, during the vertical blanking stage, the reference level is written to the second terminal of the first capacitor of the pixel driving circuit of each pixel unit by the write circuit of the pixel driving circuit, and the voltage of the first voltage terminal and the threshold voltage of the driving transistor of the pixel driving circuit are written to the first terminal of the first capacitor by the first switch transistor of the pixel driving circuit. During the effective display stage, the data level is written to the second terminal of the second capacitor of each pixel driving circuit by the write circuit of each pixel driving circuit. This causes that the driving current output from the driving transistor of each pixel driving circuit of the display device is no longer related to the threshold voltage of the driving transistor and the power supply voltage, so that the driving current of each driving transistor is no longer affected by the threshold voltage and the power supply voltage, and the occurrence of the phenomenon of uneven brightness is relieved when the image is displayed by the display device.

In some embodiments of the present disclosure, the duration time of the reference level is shorter than that of the vertical blanking stage. This facilitates increasing the normal light-emitting time of the light emitting element.

Heretofore, the embodiments of the present disclosure have been described in detail. In order to avoid obscuring the concept of the present disclosure, some details commonly known in the art are not described. From the above descriptions, those skilled in the art may fully understand how to implement the technical solutions disclosed here.

Although some specific embodiments of the present disclosure have been illustrated in detail by way of examples, it should be understood by those skilled in the art that, the above examples are merely for illustration, but do not limit the scope of the present disclosure. It should be understood by those skilled in the art that, the above embodiments may be modified or equivalent replacements may be made for some of the technical features without departing from the scope and spirit of the present disclosure. The scope of the present disclosure is defined by the appended claims.

What is claimed is:

1. A pixel driving circuit, comprising:
   a driving transistor comprising a control electrode, a first electrode electrically connected to a first voltage terminal, and a second electrode;
   a light emitting element configured to be driven by the driving transistor to emit light and disposed between the second electrode and a second voltage terminal, wherein a voltage of the second voltage terminal is different from that of the first voltage terminal;
   a first capacitor, a first terminal of which is electrically connected to the control electrode;
   a second capacitor, a first terminal of which is directly connected to the first voltage terminal or directly connected to the second voltage terminal;
   a write circuit configured to write a reference level from a data line to a second terminal of the first capacitor during a vertical blanking stage, and to write a data level from the data line to a second terminal of the second capacitor during an effective display stage, in response to a control signal from at least one control line and a gate voltage signal from a gate line, wherein the control signal comprises a first control signal and a second control signal; and
   a first switch transistor, electrically connected between the control electrode and the second electrode, and configured to write the voltage of the first voltage terminal and a threshold voltage of the driving transistor to the first terminal of the first capacitor, in response to the first control signal during the vertical blanking stage and to be turned off during the effective display stage;
   wherein the write circuit comprises:
   a second switch transistor electrically connected between the second terminal of the first capacitor and the date line and configured to be turned on in response to the first control signal during the vertical blanking stage and to be turned off during the effective display stage;
   a third switch transistor configured to be turned off in response to the second control signal during the vertical blanking stage and to be turned on during the effective display stage, wherein a terminal of the third switch transistor is directly connected to the second terminal of the first capacitor, and another terminal of the third switch transistor is directly connected to the second terminal of the second capacitor; and a fourth switch transistor electrically connected between the data line and the second terminal of the second capacitor and configured to be turned off in response to the gate voltage signal during the vertical blanking stage and to be turned on in response to the gate voltage signal corresponding to the data level during the effective display stage;

wherein the vertical blanking stage is a time period between an end time of displaying a current frame image and a start time of displaying a next frame image, and the effective display stage is a time period between a start time of displaying the current frame image and the end time of displaying the current frame image, the vertical blanking stage and the effective display stage alternate, a start time of the effective display stage is an end time of the vertical blanking stage, and an end time of the effective display stage is a start time of a next vertical blanking stage.

2. The pixel driving circuit according to claim 1, wherein the at least one control line comprises:

a first control line configured to provide the first control signal to gates of the first switch transistor and the second switch transistor; and a second control line configured to provide the second control signal to a gate of the third switch transistor, wherein a level of the second control signal is opposite to that of the first control signal;

wherein the first switch transistor, the second switch transistor and the third switch transistor are of the same type of switch transistor.

3. The pixel driving circuit according to claim 2, wherein each of the first switch transistor, the second switch transistor and the third switch transistor is a PMOS transistor or is an NMOS transistor.

4. The pixel driving circuit according to claim 1, wherein the first switch transistor and the second switch transistor have a first conductive type, and the third switch transistor has a second conductive type opposite to the first conductive type;

the at least one control line is configured to provide the same control signal to gates of the first switch transistor, the second switch transistor and the third switch transistor.

5. The pixel driving circuit according to claim 4, wherein the first switch transistor and the second switch transistor are both PMOS transistors, and the third switch transistor is an NMOS transistor;

or, the first switch transistor and the second switch transistor are both NMOS transistors, and the third switch transistor is a PMOS transistor.

6. The pixel driving circuit according to claim 1, further comprising:

a fifth switch transistor electrically connected between the second electrode of the driving transistor and the light emitting element, and the fifth switch transistor configured to interrupt an electrical coupling between the second electrode of the driving transistor and the light emitting element in response to the control signal during the vertical blanking stage, and to turn on the electrical coupling between the second electrode of the driving transistor and the light emitting element during the effective display stage.

7. The pixel driving circuit according to claim 6, wherein the at least one control line comprises:

a first control line configured to provide a first control signal to gates of the first switch transistor and the second switch transistor; and a second control line configured to provide a second control signal to gates of the third switch transistor and the fifth switch transistor, wherein a level of the second control signal is opposite to that of the first control signal;

wherein the first switch transistor, the second switch transistor, the third switch transistor and the fifth switch transistor are of the same type of switch transistor.

8. The pixel driving circuit according to claim 7, wherein each of the first switch transistor, the second switch transistor, the third switch transistor and the fifth switch transistor is a PMOS transistor or is an NMOS transistor.

9. The pixel driving circuit according to claim 6, wherein the first switch transistor and the second switch transistor have a first conductive type, and the third switch transistor and the fifth switch transistor have a second conductive type opposite to the first conductive type;

the at least one control line is configured to provide the same control signal to gates of the first switch transistor, the second switch transistor, the third switch transistor and the fifth switch transistor.

10. The pixel driving circuit according to claim 9, wherein the first switch transistor and the second switch transistor are both PMOS transistors, and the third switch transistor and the fifth switch transistor are both NMOS transistors;

or, the first switch transistor and the second switch transistor are both NMOS transistors, and the third switch transistor and the fifth switch transistor are both PMOS transistors.

11. The pixel driving circuit according to claim 1, wherein the driving transistor is a PMOS transistor, the first voltage terminal is a power supply voltage terminal, and the second voltage terminal is a ground terminal;

or, the driving transistor is an NMOS transistor, the first voltage terminal is a ground terminal, and the second voltage terminal is a power supply voltage terminal.

12. The pixel driving circuit according to claim 11, wherein in the case that the driving transistor is a PMOS transistor, the first terminal of the second capacitor is electrically connected to the power supply voltage terminal;

or, in the case that the driving transistor is an NMOS transistor, the first terminal of the second capacitor is electrically connected to the ground terminal.

13. A display device, comprising:

a pixel array, comprising a plurality of pixel units, each of the pixel units comprising a pixel driving circuit according to claim 1;

at least one control line electrically connected to the pixel driving circuit of each of the pixel units;

a plurality of data lines, wherein each of the data lines is electrically connected with the pixel driving circuit of each of the pixel units in the same column of the pixel array; and a plurality of gate lines, wherein each of the gate lines is electrically connected with the pixel driving circuit of each of the pixel units in the same row of the pixel array.

14. The display device according to claim 13, further comprising:
a first power line electrically connected to the first voltage terminal corresponding to the pixel driving circuit of each of the pixel units and configured to provide a voltage of the first voltage terminal; and
a second power line electrically connected to the second voltage terminal corresponding to the pixel driving circuit of each of the pixel units and configured to provide a voltage of the second voltage terminal.

15. The display device according to claim 14, wherein
in the case that the driving transistor of the pixel driving circuit is a PMOS transistor, the first power line is a power supply voltage line, and the second power line is a ground line;
in the case that the driving transistor of the pixel driving circuit is an NMOS transistor, the first power line is a ground line, and the second power line is a power supply voltage line.

16. A driving method for the pixel driving circuit according to claim 1, comprising:
receiving a reference level during a vertical blanking stage;
writing the reference level to a second terminal of a first capacitor by a write circuit, and writing a voltage of a first voltage terminal and a threshold voltage of a driving transistor to a first terminal of the first capacitor by a first switch transistor;
receiving a data level during an effective display stage;
writing the data level to a second terminal of a second capacitor by the write circuit, and obtaining a voltage applied to a control electrode of the driving transistor by the first capacitor, so that the driving transistor outputs a current corresponding to a voltage between the control electrode and a first electrode of the driving transistor, for driving a light emitting element to emit light.

17. The driving method according to claim 16, wherein a duration time of the reference level is shorter than that of the vertical blanking stage.

18. A driving method for the display device according to claim 13, comprising:
receiving a reference level during a vertical blanking stage;
writing the reference level to a second terminal of a first capacitor of a pixel driving circuit of each pixel unit by a write circuit of the pixel driving circuit, and writing a voltage of a first voltage terminal and a threshold voltage of a driving transistor of the pixel driving circuit to a first terminal of the first capacitor by a first switch transistor of the pixel driving circuit;
for each row of pixel units, sequentially receiving a data level for the pixel driving circuit of each pixel unit in the row during an effective display stage; and
writing the data level to a second terminal of a second capacitor of each pixel driving circuit by a write circuit of each pixel driving circuit, and obtaining a voltage applied to a control electrode of a driving transistor of each pixel driving circuit by a first capacitor of each pixel driving circuit, so that the driving transistor outputs a current corresponding to a voltage between the control electrode and a first electrode of the driving transistor, to drive a light emitting element of each pixel driving circuit to emit light.

19. The driving method according to claim 18, wherein a duration time of the reference level is shorter than that of the vertical blanking stage.

* * * * *